(12) United States Patent
Li et al.

(10) Patent No.: US 11,093,071 B2
(45) Date of Patent: Aug. 17, 2021

(54) TOUCH PANEL AND TRACE STRUCTURE THEREOF

(71) Applicant: TPK Glass Solutions (Xiamen) Inc., Xiamen (CN)

(72) Inventors: Jui-Hsing Li, Taoyuan (TW); Lien-Hsin Lee, Taipei (TW)

(73) Assignee: TPK Glass Solutions (Xiamen) Inc., Xiamen (CN)

( * ) Notice: Subject to any disclaimer, the term of this patent is extended or adjusted under 35 U.S.C. 154(b) by 0 days.

(21) Appl. No.: 15/973,444

(22) Filed: May 7, 2018

(65) Prior Publication Data

US 2018/0335874 A1    Nov. 22, 2018

(30) Foreign Application Priority Data

May 22, 2017    (CN) .......................... 201710387754.0

(51) Int. Cl.
  *G06F 3/047*    (2006.01)
  *G06F 3/041*    (2006.01)
  *H05K 1/18*    (2006.01)
  *H05K 1/09*    (2006.01)
  *G06F 3/044*    (2006.01)

(52) U.S. Cl.
  CPC .......... *G06F 3/04164* (2019.05); *G06F 3/047* (2013.01); *G06F 3/0412* (2013.01); *G06F 3/0446* (2019.05); *H05K 1/097* (2013.01); *H05K 1/189* (2013.01); *G06F 2203/04103* (2013.01); *G06F 2203/04111* (2013.01); *H05K 2201/026* (2013.01); *H05K 2201/0391* (2013.01)

(58) Field of Classification Search
  CPC ................... G06F 3/047; G06F 3/0412; G06F 2203/04103; B22F 1/00; B22F 1/0003; B22F 1/0007; B22F 1/0011; B22F 1/0018; B22F 1/0025; B22F 9/18; B22F 9/20; B22F 9/24; C01B 31/00; C01B 31/02; C01B 31/0206; C01B 31/022; C01B 31/0293; C01B 31/04; H05K 2201/03; H05K 2201/0302; H05K 2201/032; H05K 2201/323; H05K 2201/0326; H05K 2201/0329; H05K 2201/07; H05K 2201/0707; H05K 2203/0104; H05K 2203/03; H05K 2203/0315; H05K 2203/0323; H05K 2203/0353; H05K 2203/0361; H05K 2203/0369; H05K 2203/0376; H05K 2203/0384; H05K 2203/0392
  See application file for complete search history.

(56) References Cited

U.S. PATENT DOCUMENTS

2014/0152912 A1*   6/2014   Lee .................... G06F 3/0412
                                              349/12
2015/0220202 A1*   8/2015   Choung ................ G06F 3/0446
                                              345/174

(Continued)

*Primary Examiner* — William Boddie
*Assistant Examiner* — Jeffrey Parker
(74) *Attorney, Agent, or Firm* — Cooper Legal Group, LLC

(57) ABSTRACT

A trace structure includes a substrate, at least one metal trace, and a cover. The metal trace is disposed on the substrate, and has sidewalls and a top surface. The cover is disposed on the sidewalls and the top surface of the metal trace, and the cover includes metal nanowires. The cover and the metal trace have different etch resistances.

20 Claims, 13 Drawing Sheets

(56) References Cited

U.S. PATENT DOCUMENTS

| | | | |
|---|---|---|---|
| 2015/0370377 A1* | 12/2015 | Ohara | G06F 3/044 |
| | | | 345/174 |
| 2017/0188456 A1* | 6/2017 | Cho | G06F 3/047 |
| 2018/0101258 A1* | 4/2018 | Cho | G06F 3/041 |
| 2019/0114003 A1* | 4/2019 | Gao | G06F 3/0445 |

* cited by examiner

TOUCH PANEL AND TRACE STRUCTURE THEREOF

CROSS-REFERENCE TO RELATED APPLICATION

This application claims priority to China Application Serial Number 201710387754.0, filed May 22, 2017, which is herein incorporated by reference.

BACKGROUND

Technical Field

The present disclosure relates to touch panels and trace structures thereof.

Description of Related Art

In recent years, transparent conductors, which are capable of transmitting light and providing suitable conductivity, are widely used in various display or touch devices. In general, transparent conductors may be various metal oxides, such as indium tin oxide (ITO), indium zinc oxide (IZO), cadmium tin oxide (CTO), or aluminum-doped zinc oxide (AZO). The metal oxide films may be formed by physical vapor deposition or chemical vapor deposition process, and patterned by photolithography. However, the fabrication process of the metal oxide films may have drawbacks such as high cost, complicated process, and low yield rate. In some situations, patterned metal oxide electrodes are readily visible to user which is a drawback as well. As a result, multiple transparent conductors are now developed, such as the transparent conductors fabricated from newly-developed materials, e.g. nanowires.

However, issues persist regarding fabrication processes using the nanowires. For example, when the nanowires are employed in fabrication of touch electrodes, as material properties (e.g., etching rate or resistance) of the nanowires are quite different from those of traces in a peripheral area, it is necessary to establish novel fabrication processes or electrode structures according to the material properties of the nanowires to solve the mentioned issues and improve the performance of products.

SUMMARY

In some embodiments of the present disclosure, the metal traces are designed to be covered by the covers which are at least formed of metal nanowires, thereby achieving the protection effect on the metal traces. For example, the exposed surfaces of the metal traces are protected in the process of forming the touch sensing electrodes by etching the conductive film layer containing the metal nanowires. In addition, in some embodiments of the present disclosure, novel methods for forming the touch electrodes and the traces thereof are proposed, and therefore structures of the touch panels are different from traditional touch panels.

According to some embodiments of the present disclosure, a trace structure includes a substrate, at least one first metal trace, and a first cover. The first metal trace is disposed on the substrate, and the first metal trace has a sidewall and a top surface. The first cover covers the sidewall and the top surface of the first metal trace, wherein the first cover includes metal nanowires, and the first cover and the first metal trace have different etch resistances.

In some embodiments of the present embodiments, the first cover including a film layer and metal nanowires covers the sidewall and the top surface of the first metal trace. The metal nanowires are embedded in the film layer, and the film layer and the metal nanowires integrally form the first cover.

In some embodiments of the present embodiments, the metal nanowires protrude from a surface of the film layer.

In some embodiments of the present embodiments, the first cover at the sidewall of the first metal trace has a first thickness, and the first cover over the top surface of the first metal trace has a second thickness less than the first thickness.

In some embodiments of the present embodiments, the trace structure further includes a second metal trace and a non-conductive region. A sidewall and a top surface of the second metal trace are covered by a second cover, and the film layer and the metal nanowires integrally form the second cover. The non-conductive region is disposed between the first cover and the second cover. The non-conductive region has a filling layer having the same material as that of the film layer, and the first cover is electrically insulated from the second cover.

In some embodiments of the present embodiments, a concentration of the metal nanowires in the filling layer is zero.

In some embodiments of the present embodiments, the filling layer includes the metal nanowires, and a concentration of the metal nanowires in the filling layer is less than a percolation threshold, such that the metal nanowires in the filling layer forms a non-conductive network.

In some embodiments of the present embodiments, the trace structure further includes a second metal trace and a non-conductive region. A sidewall and a top surface of the second metal trace is covered by a second cover, and the film layer and the metal nanowires in combination form the second cover. The non-conductive region is disposed between the first cover and the second cover. The non-conductive region has a gap to physically separate the two cover, and thus the first cover is electrically insulated from the second cover.

In some embodiments of the present embodiments, the film layer is a conductive polymer or a non-conductive polymer.

In some embodiments of the present embodiments, the trace structure further includes a second metal trace and a non-conductive region. A sidewall and a top surface of the second metal trace are covered by a second cover, and the second cover includes the metal nanowires. The non-conductive region is disposed between the first cover and the second cover, wherein the non-conductive region has a gap to physically separate the two cover, and thus, the first cover is electrically insulated from the second cover.

According to some embodiments of the present disclosure, the touch panel includes a substrate, plural metal traces, plural covers, and a touch sensing electrode. The substrate has a display area and a peripheral area. The metal traces are disposed on the substrate, and each of the metal traces has a sidewall and a top surface. The covers cover the sidewall and the top surface of the metal traces. Each of the covers includes metal nanowires, and the covers and the metal traces have different etch resistances, and the metal traces and the covers are disposed in the peripheral area of the substrate. The touch sensing electrode is disposed in the display area of the substrate, and the touch sensing electrode is electrically connected with the metal traces.

In some embodiments of the present embodiments, each of the covers includes a film layer covering the sidewall and the top surface of the metal traces. The metal nanowires are embedded in the film layer. The film layer and the metal nanowires in the peripheral area integrally form the covers, and the film layer and the metal nanowires in the display area integrally form the touch sensing electrode.

In some embodiments of the present embodiments, the touch panel further includes a non-conductive region disposed in the display area and the peripheral area.

In some embodiments of the present embodiments, the non-conductive region has a filling layer having the same material as that of the film layer.

In some embodiments of the present embodiments, a concentration of the metal nanowires in the filling layer is zero.

In some embodiments of the present embodiments, the filling layer includes the metal nanowires, and a concentration of the metal nanowires in the filling layer is less than a percolation threshold, such that the metal nanowires in the filling layer forms a non-conductive network.

In some embodiments of the present embodiments, the non-conductive region has a gap.

In some embodiments of the present embodiments, the film layer is a conductive polymer or a non-conductive polymer.

In some embodiments of the present embodiments, the metal traces and the covers extend to a bonding area, the metal nanowires in the bonding area are exposed, and an external circuit board is electrically connected with the metal traces through the exposed metal nanowires of the covers in the bonding area.

In some embodiments of the present embodiments, the metal traces and the covers extend to a bonding area, the covers have a via hole in the bonding area, and an external circuit board is electrically connected with the metal traces through the via hole.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
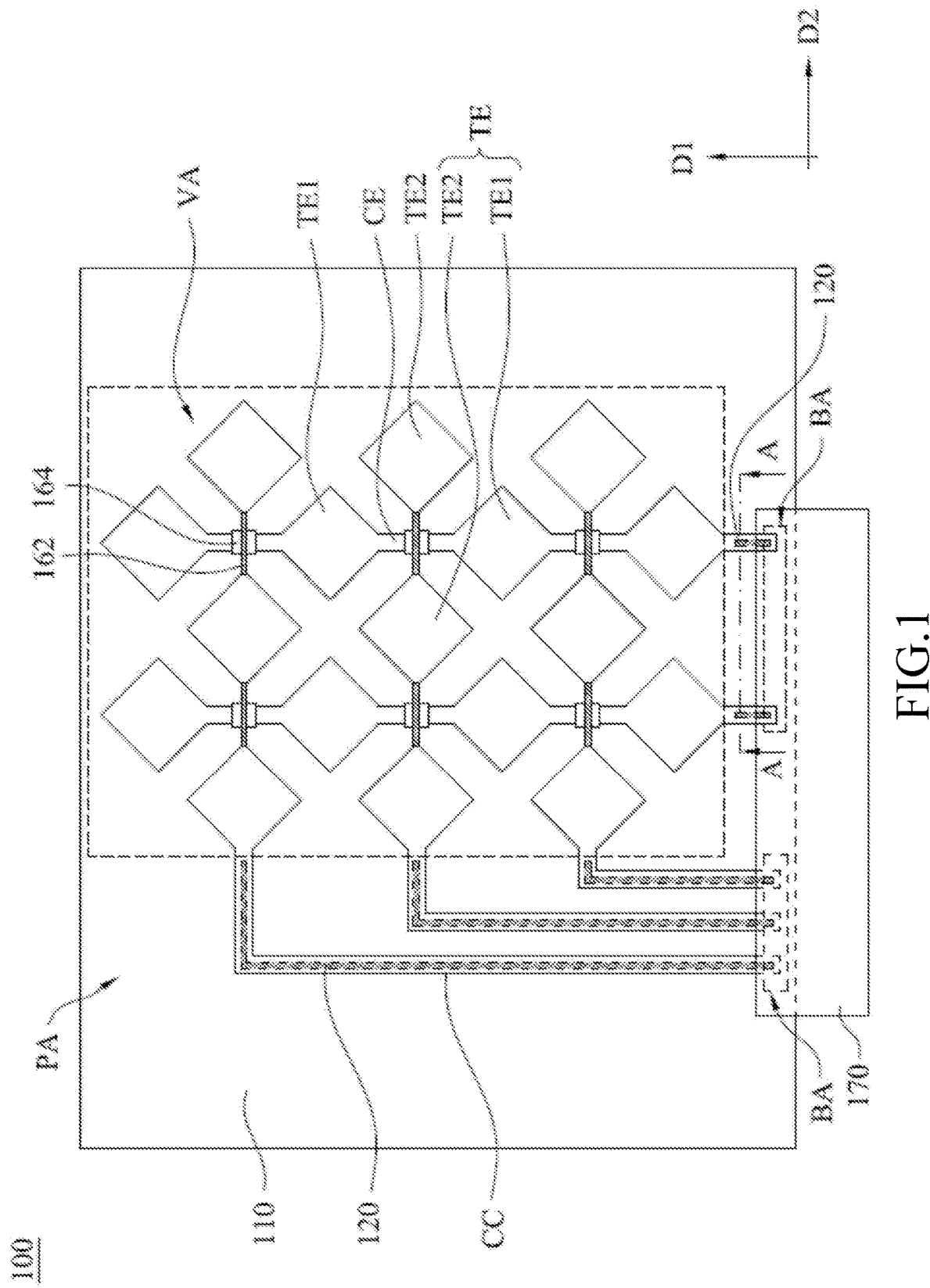
FIG. 1 is a schematic top view of a touch panel according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated. In addition, as used herein, "film layer", "coating layer," "polymer," or "precursor" shall mean identical or similar elements, the difference therebetween mainly lying in the curing state thereof, and it is noted the terms may be alternatively used below for convenience of illustration.

Figure 1A:
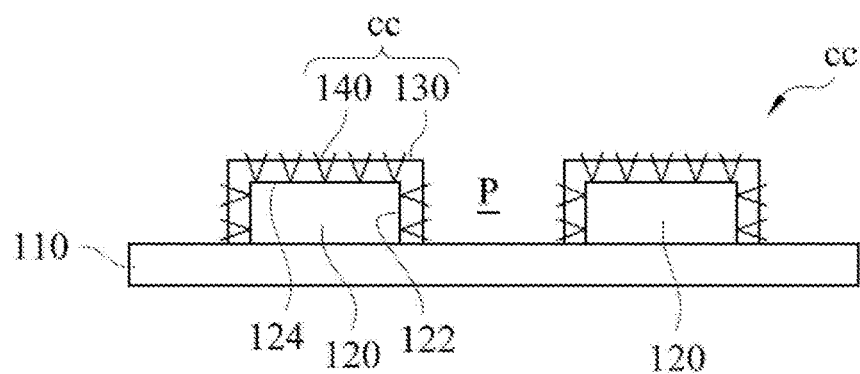
FIG. 1A is a schematic cross-sectional view taken along line A-A of FIG. 1.

FIG. 1 is a schematic top view of a touch panel 100 according to some embodiments of the present disclosure. The touch panel 100 includes a substrate 110, plural metal traces 120, plural covers CC, and touch electrodes TE. The number of the metal traces 120, the covers CC, and the touch electrodes TE may be one or more. In the following embodiments and figures, the numbers thereof are only used for illustration, and should not limit the scope of the present disclosure. Reference is made to FIG. 1. The substrate 110 has a display area VA and a peripheral area PA. The peripheral area PA is disposed at a side of the display area VA. For example, as shown in FIG. 1A, the peripheral area PA is disposed at a left side and a lower side of the display area VA, and is an L-shaped region. In other embodiments, the peripheral area PA may be disposed at four sides of the display area VA (i.e., the right side, the left side, the lower side, and the upper side), and is a frame-shaped area. FIG. 1 shows five sets of the metal traces 120 and the covers CC corresponding to the metal traces 120 over the peripheral area PA of the substrate 110, and some touch electrodes TE, which are electrically connected with the metal traces 120, disposed over the display area VA of the substrate 110. The covers CC and the metal traces 120 have different etch resistances. Through the configuration in which the covers CC cover or wrap over the exposed surfaces of the metal traces 120, in the fabrication process, the metal traces 120 are protected from lateral erosion/corrosion/etch, for example, sidewalls 122 of the metal traces 120 are protected from being damaged by etchant (e.g., etchant solutions having high etching rate to metals) used in an etching process, thereby preventing electrical or reliability problems in products. It is noteworthy that the "covering" mentioned herein, is not limited to fully covering, but it is within the scope of the present disclosure that the metal traces 120 are protected by the covers CC under a certain circumstance. The wording "etch resistance" may mean the covers CC and the metal traces 120 have different etching rates to a specific etchant.

To be specific, in some embodiments, the metal traces 120 may be made of metals with good conductivity. The metal traces 120 may be a single-layered metal structure, such as a silver layer, a copper layer, and so on; alternatively, the metal traces 120 may be a multi-layered conductive structure, such as molybdenum/aluminum/molybdenum and so on. The covers CC may at least be a layer of metal nanowires, such as a layer of silver nanowires, a layer of gold nanowires, or a layer of copper nanowires. To be specific, "metal nanowires" used herein is a collective noun, which is referred to as a collection that includes metal wires made of a metallic element, metallic alloy, or metallic compound (including metal oxides), in which the number of the metal nanowires does not limit the scope of the present disclosure. A cross-sectional size (i.e. a diameter of the cross-section) of a single metal nanowire is less than 500 nanometers, preferably less than 100 nanometers, more preferably less than 50 nanometers. In the present disclosure, the metal nano structure referred to as "wire" herein has a high aspect ratio (i.e., the ratio of length of the nanowire to diameter of cross section of the nanowire), for example, in a range from 10 to 100000. To be specific, the high aspect ratio may be greater than 10, preferably greater than 50, and more preferably greater than 100. The metal nanowires can be any kinds of metals including, but not limited to, silver, gold, copper, nickel, and gold-plated silver. Other terms, such as string, fiber, tube, and so on, that have similar features with the aforementioned size and/or aspect ratio, are within the scope of the present disclosure.

Figure 1B:
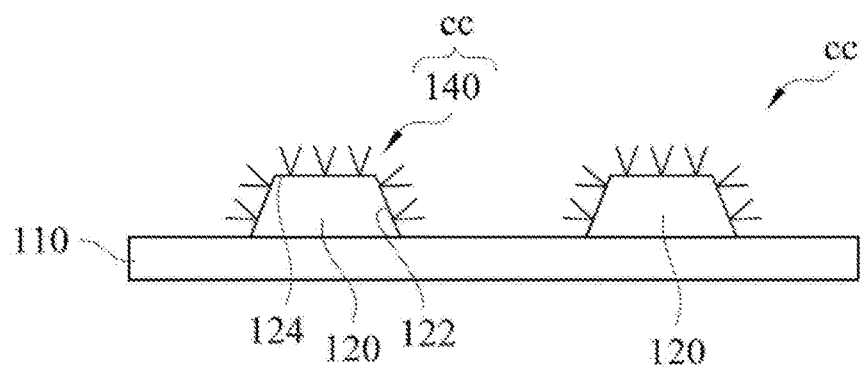
FIGS. 1B to 1E are schematic cross-sectional views of trace structures according to various embodiments of the present disclosure.
Figure 1C:
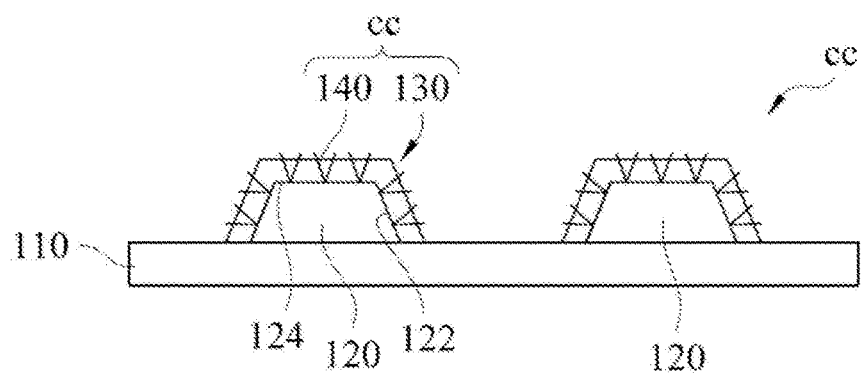
Figure 1D:
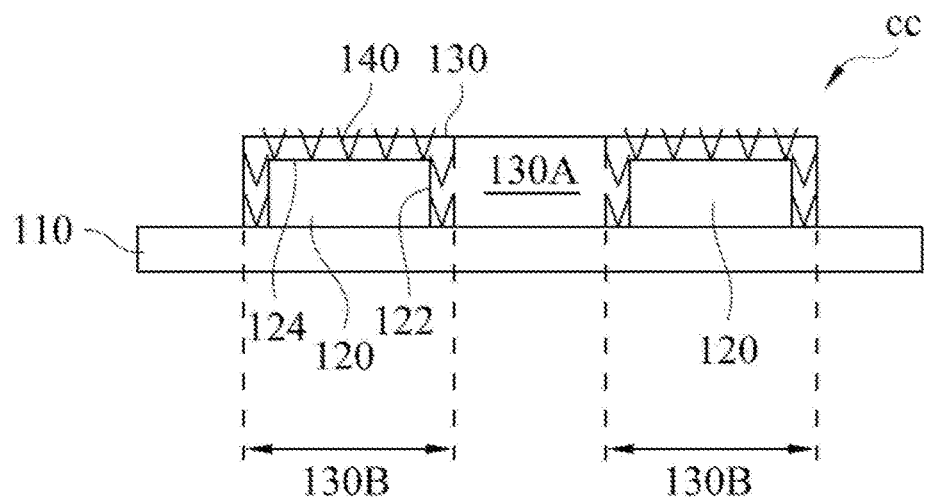
Figure 1E:
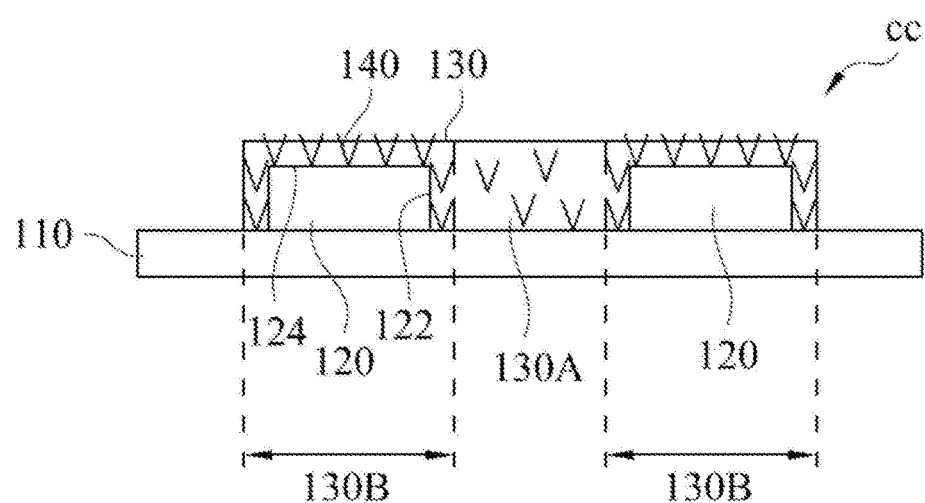

Trace structures in some embodiments of the present disclosure are illustrated in the following. FIG. 1A is a schematic cross-sectional view taken along line A-A of FIG. 1. FIGS. 1B to 1E are schematic cross-sectional views of trace structures according to various embodiments of the present disclosure. Embodiments of various structures are illustrated in aspect of fabrication process, rather than illustrated in the sequence of the drawings. FIGS. 1B and 1C may be considered as one type of fabrication processes; FIGS. 1A, 1D, and 1E may be considered as another type of fabrication processes.

FIGS. 1B and 1C may be considered types of fabrication processes without the need for etching steps. Reference is made to FIG. 1B. As FIG. 1B shows, the cover CC covers two sidewalls 122 and a top surface 124 of the metal trace 120, thereby protecting the metal trace 120. As a consequence, the cover CC may be referred to as a protection layer. In some embodiments of the present disclosure, metal nanowires 140, such as silver nanowires, may form the cover CC, and the cover CC may be formed on the sidewalls 122 and the top surface 124 of the metal trace 120 through printing, coating, or other suitable methods. For better illustration, a cross-section of the metal trace 120 of the embodiments of the present disclosure is a quadrangle, such as the trapezoid shown in FIG. 1B, and therefore the cover CC may be coated to cover the exposed sidewalls 122 and the exposed top surface 124 of the metal trace 120. The structural configuration or numbers of the sidewalls 122 and the top surface 124 of the metal trace 120 may vary according to the actual application, and is not limited to the descriptions or drawings submitted.

In the described embodiments, because the metal nanowires 140 are distributed randomly over the sidewalls 122 and the top surface 124 of the metal trace 120, the metal nanowires 140 may or may not fully cover the two sidewalls 122 and the top surface 124 of the metal trace 120. In the present disclosure, it is regarded that an area covered by the metal nanowires 140 is greater than 80% of a sum area of the two sidewalls 122 and the top surface 124 of the metal trace 120 (i.e., 80% of an area of the exposed surface of the metal trace 120). Therefore, the cover CC formed of the metal nanowires 140 may have a protection effect on the metal trace 120 according to the above-mentioned covered ratio of the exposed surface of the metal trace 120. Preferably, the area covered by the metal nanowires 140 is greater than 95% of the sum area of the two sidewalls 122 and the top surface 124 of the metal trace 120. In addition, the sidewalls 122 of the metal trace 120 are not perpendicular to the substrate 110 in the present embodiments. In other words, the sidewalls 122 of the metal trace 120 are inclined. Since the sidewalls 122 of the metal trace 120 are inclined, in the previous printing process, the metal nanowires 140 can be formed over and cover the sidewalls 122 of the metal trace 120.

FIG. 1C shows a trace structure according to another embodiment of the present disclosure. The difference between the configuration shown in FIG. 1C and that shown in FIG. 1B is mainly and at least that: in FIG. 1C, the cover CC is formed of the film layer 130 and the metal nanowires 140 (e.g., silver nanowires). Similarly, the cover CC covers the sidewalls 122 and the top surface 124 of the metal trace 120, and therefore has a protective effect on the metal trace 120. In some embodiments of the present disclosure, the film layer 130 is made of polyethylene (PE), polypropylene (PP), polyvinyl butyral, (PVB), polycarbonate(PC), acrylonitrile butadiene styrene (ABS), poly(3,4-ethylenedioxythiophene) (PEDOT), poly(styrenesulfonate) (PSS), ceramic materials, or the like. An exemplary method for fabricating the covers CC may include: printing a partially-solidified film layer 130 (e.g. a precursor of one of the above-mentioned materials) over the sidewalls 122 and the top surface 124 of the metal trace 120; embedding, mixing or blending the metal nanowires 140 into the partially-solidified film layer 130, wherein the metal nanowires 140 may be considered a kind of additive; removing the metal nanowires 140 that are not embedded, mixed or blended into the partially-solidified film layer 130, for example, cleaning with a solvent to remove the metal nanowires 140 attached to the surface of the substrate 110; and finally solidifying the partially-solidified film layer 130, thereby forming the covers CC, that combines the metal nanowires 140 with the film layer 130, having protection effect to the metal trace 120. The embedding, mixing or blending of the metal nanowires 140 into the partially-solidified film layer 130 is performed without considering whether the metal nanowires 140 forms a conductive network in the film layer 130, but considering if the covers CC formed of the metal nanowires 140 and the solidified film layer 130 are capable of protecting the metal traces 120. That is, in the embodiments, the covers CC are not limited to being conductive or insulating/non-conductive. Moreover, the metal nanowires 140 may protrude out of the surface of the film layer 130 (as shown in FIG. 1C) or be fully encapsulated inside the film layer 130 and not exposed out of the surface of the film layer 130.

The difference between the present embodiments and the embodiments of FIG. 1B is mainly and at least that: in the present embodiments, since the forming film layer 130 is initially formed over the sidewalls 122 and the top surface 124 of the metal trace 120, a sum area of the sidewalls 122 and the top surface 124 of the metal trace 120 (i.e., the exposed area of the metal trace 120) can be deemed as being fully (e.g., about 100%) covered by the covers CC that combine the metal nanowires 140 with the film layer 130.

Preferably, the sidewalls 122 of the metal trace 120 are inclined surfaces, such that the film layer 130 may be efficiently formed over and cover the sidewalls 122 of the metal trace 120 by the above printing process. Also, it can facilitate the fabrication step of embedding, mixing or blending the metal nanowires 140 into the partially-solidified film layer 130.

FIG. 1A, FIG. 1D, and FIG. 1E may be considered as other types of fabrication processes with etching steps. First of all, FIG. 1A shows the covers CC formed of the film layer 130 and the metal nanowires 140 (e.g. silver nanowires).

Similarly, the cover CC is formed on the sidewalls 122 and the top surface 124 of the metal trace 120, thereby protecting the metal trace 120. In the embodiments, in detail, an exemplary method for fabricating the covers CC may include: applying a dispersant or ink having the metal nanowires 140 onto an entire top surface of the substrate 110 and the metal traces 120, and drying the dispersant or ink such that the metal nanowires 140 are attached to the surface of the substrate 110 and over the exposed surfaces of the metal traces 120 over the substrate 110; applying a suitable polymer onto the substrate 110, in which the polymer flows into and penetrates the spaces between the metal nanowires 140 and forms a filler; performing a curing step on the polymer, and thereby forming the film layer 130 in which the metal nanowires 140 are embedded; and finally performing a patterning step so as to remove portions of the film layer 130 and the metal nanowires 140. In the patterning step, for example, the film layer 130 and the metal nanowires between two metal traces 120 are removed, and a gap P is formed. The sidewalls 122 and the top surface 124 of the metal trace 120 are covered by the remaining portions of the film layer 130 and the metal nanowires 140. To be brief, as FIG. 1A shows, the gap P is utilized to form a non-conductive region between the left metal trace 120 (i.e. the first metal trace) and the right metal trace 120 (i.e. the second metal trace), such that the cover CC over the left metal trace 120 (i.e. the first cover) is electrically insulated from the cover CC over the right metal trace 120 (i.e. the second cover). The first and second metal traces are prevented from short circuit due to the non-conductive region, and in the embodiment, the non-conductive region is defined by the gap which is formed in the patterning step.

In some embodiments of the present disclosure, the aforementioned dispersant may be water, alcohol, ketone, ether, hydrocarbon, or aromatic solvents (e.g., benzene, toluene, xylene); the aforementioned dispersant may also include additive, surfactant, or adhesive, such as carboxymethyl cellulose (CMC), hydroxyethyl Cellulose (HEC), hydroxypropyl methylcellulose (HPMC), sulfonic esters, sulfuric esters, disulfonate, sulfonic succinate, phosphate ester, or fluoro surfactants.

Exemplary polymers may include, but are not limited to, polyacrylate resin, such as polymethyl acrylate (e.g. polymethylmethacrylate (PMMA)), polyacrylate, and polyacrylonitrile; polyvinylalcohol; polyester (e.g. polyethylene terephthalate(PET), polyester naphtalate, and polycarbonate); polymers having high-degree aromaticity, such as phenolic resins, cresol-formaldehyde resin, polystyrene (PS), polyvinyl toluene, polyvinylxylene, polyimide, polyamide, polyamide-imide, polyetherimide (PEI), polysulfide, polysulfone, polyphenylene, polyphenyl ethers; polyurethane (PU); epoxy; polyolefine (e.g. polypropylene, polymethylpentene, and cycloalkene); cellulose; silicone and other silicon polymers (e.g. polysilsesquioxane and polysilane); polyvinylchloride (PVC); polyacetate ester; polynorbornene; synthetic rubber (e.g. ethylene-propylene rubber (EPR), styrene-Butadiene Rubber (SBR), ethylene-Propylene-Diene Monomer (EPDM)); fluorine-containing polymer (e.g. poly(vinylidene fluoride) (PVDF), polytetrafluoroethylene (PTFE), or polyhexafluoropropylene); and fluoro-olefin and hydrocarbon olefin copolymers, etc. In other embodiments, the film layer 130 may be made of inorganic materials, such as silicon dioxide, mullite, aluminium oxide, silicon carbide (SiC), carbon fiber, $MgO-Al_2O_3-SiO_2$, $Al_2O_3-SiO_2$, or $MgO-Al_2O_3-SiO_2-Li_2O$. In addition, in the structure shown in FIG. 1A, since the film layer 130 and the metal nanowires 140 between two metal traces 120 are fully removed to form a gap for structurally or physically separating the adjacent metal traces 120, conductive polymers including, but not limited to, poly(3,4-ethylenedioxythiophene) (PEDOT), polyanilene, polythiophene, or polydiacetylene, may be utilized as the film layer 130.

On the other hand, it is noted that the aforementioned sequence of fabrication process or steps does not limit the present disclosure. For example, the aforementioned patterning step may be performed in any suitable stage in the fabrication process, and is not limited to the aforementioned sequence. To be specific, the patterning operation may be performed in the curing operation over the polymer. An exemplary method includes choosing a photo-curable polymer and using a mask to shield a region of the polymer to be removed, such that the polymer exposed to an irradiation region is cured, and the polymer in a non-irradiation region remains uncured. Further, the polymer and the metal nanowires 140 in the non-irradiation region are removed by an adhesive tape or a sticky roller, thereby forming the gap P.

The difference between the present embodiments of FIG. 1A and the embodiments of FIG. 1B is mainly and at least that: in the present embodiments, the substrate 110 is fully coated with metal nanowires 140 and/or polymer, and portions of which between the two metal traces 120 are then removed so that a sum area of the sidewalls 122 and the top surface 124 of the metal trace 120 (i.e. the exposed area of the metal trace 120) are fully (i.e. about 100%) covered by the corresponding cover CC. In addition, the sidewalls 122 of the metal traces 120 may be or may not be perpendicular to the substrate.

In addition, after the curing operation, the polymer may provide specific chemical, mechanical, and optical properties to the composite structures (i.e., the covers CC) of the film layer 130 and the metal nanowires 140. For example, the polymer provides for a higher adhesive strength between the covers CC and the substrate 110, or a higher physical strength of the composite structures (i.e., the covers CC). The film layer 130 may also be referred to as a matrix. The film layer 130 may be made of some specific polymer, such that the covers CC have additional surface protection against scratching and abrasion, in which the film layer 130 may also be referred to as a hard coat. For example, materials, such as polyacrylate, epoxy, polyurethane (PU), polysilane, silicone, poly(silico-acrylic), and so on, may provide the covers CC with a higher surface strength and a higher resistance to scratching. Moreover, the film layer 130 may be doped with UV stabilizers, thereby enhancing a resistance to UV light of the covers CC. However, the above description illustrates the possibility of additional function/alternative names of the film layer 130, and is not intended to limit the scope of the present disclosure.

FIG. 1D shows another embodiment of the trace structure of the present disclosure. The difference between the present embodiment of FIG. 1D and the embodiment of FIG. 1A is mainly and at least that: there is no gap P between two metal traces 120. Herein, the film layer 130 is defined to have a first film region 130A and a second film region 130B. The film layer 130 in the first film region 130A does not include the metal nanowires 140 (i.e. the concentration of the metal nanowires 140 is zero), and the film layer 130 in the second film region 130B is embedded with the metal nanowires 140 as in the aforementioned embodiments. That is, the film layer 130 covers plural metal traces 120 (as FIG. 1D shows, the film layer 130 covers the first metal trace on the left and the second metal trace on the right), and by changing the concentration of the metal nanowires 140 in the film layer 130, non-conductive/insulating regions (i.e., the first film regions 130A) are formed for electrically insulating the neighboring metal traces 120. To be brief, there is a filling layer formed of the same polymer as the film layer 130 in the first film regions 130A, but the filling layer in the first film regions 130A is not embedded with the metal nanowires 140, such that a non-conductive region is defined between the two neighboring covers CC. In other words, the first and second metal traces are prevented from short circuiting due to the non-conductive region, and in the embodiment, the non-conductive region is defined by the filling layer, which is formed of the polymer without metal nanowires 140 embedded therein. In addition, in the second film region 130B, the covers CC are formed of the film layer 130 and the metal nanowires 140, and the covers CC cover the sidewalls 122 and the top surface 124 of the metal traces 120 as well as the mentioned embodiments, thereby achieving the protection effect on the metal traces 120.

In the present embodiment, an exemplary method for fabricating the covers CC may include: applying a dispersant or ink having the metal nanowires 140 onto a whole top surface of the substrate 110 and the metal traces 120, and drying the dispersant or ink such that the metal nanowires 140 are attached to the surface of the substrate 110 and over the exposed surface of the metal traces 120 over the substrate 110; applying a suitable polymer onto the substrate 110, in which the polymer flows into and penetrates the spaces between the metal nanowires 140 and forms a filler; performing a curing step over the polymer, and thereby forming the film layer 130 where the metal nanowires 140 are embedded in; and finally performing an etching step, in which an etchant or solvent penetrates the film layer 130 and removes the metal nanowires 140 in the first film region 130A. For example, an over-etch operation is performed to fully remove the metal nanowires 140 in the first film region 130A and leave the sidewalls 122 and the top surface 124 of the metal traces 120 covered by the film layer 130 and the remaining metal nanowires 140. The over-etch operation also refers to a full-etch operation. It is known from the above steps that the filling layer in the first film region 130A and the film layer 130 in the second film region 130B are made of the same material or polymer. Furthermore, since the film layer remains between the covers CC over the left and right metal traces 120 (i.e. the first and second covers), in the present embodiments, the polymer forming the film layer 130 and the filling layer is preferably a non-conductive polymer.

FIG. 1E shows another embodiment of the trace structure of the present disclosure. The difference between the present embodiment of FIG. 1E and the embodiment of FIG. 1D is mainly and at least that: the film layer 130 in the first film region 130A and the film layer 130 in the second film region 130B are both embedded with the metal nanowires 140. Herein, the film layer 130 in the first film region 130A (i.e. the filling layer in the aforementioned embodiments) are embedded with the metal nanowires 140 with a concentration lower than a percolation threshold. An electrical conductivity of the composite structures of the film layer 130 and the metal nanowires 140 (i.e., the covers CC) is influenced at least by the following factors: (a) an electrical conductivity of single metal nanowire 140, (b) the number of the metal nanowires 140, and (c) the connectivity (or referred to as an ability of contact) between the metal nanowires 140. If the concentration of the metal nanowires 140 is lower than the percolation threshold, the metal nanowires 140 are spaced apart too far to contact with each other, and the composite structures of the film layer 130 and the metal nanowires 140 may not have enough electrical conductivity. That is, the metal nanowires 140 in the first film region 130A do not provide a continuous electrical current path, and therefore the metal nanowires 140 in the first film region 130A cannot form a conductive network, but form a non-conductive network. Above this concentration (i.e., percolation threshold), there is at least one current path available. In an embodiment, the area of composite layer or a structure may be considered non-conductive if it has a sheet resistance of higher than $10^8$ Ω/□ (ohm/square), preferably higher than $10^4$ Ω/□ (ohm/square), 3000 Ω/□ (ohm/square), 1000 Ω/□ (ohm/square) or 350 Ω/□ (ohm/square), or 100 Ω/□ (ohm/square).

As shown in FIG. 1E, the film layer 130 covers plural metal traces 120 (e.g. the film layer 130 covers the first metal trace on the left and the second metal trace on the right), and by changing the concentration of the metal nanowires 140 in the film layer 130, the non-conductive/insulating regions (i.e., the first film regions 130A) are formed with low concentration of the metal nanowires 140 for electrically insulating the neighboring metal traces 120. To be brief, the filling layer in the first film regions 130A and the film layer 130 are formed of the same polymer, and the metal nanowires 140 in the first film regions 130A do not form a conductive network, such that a non-conductive region is defined between the two neighboring covers CC. In other words, the first and second metal traces are prevented from short circuiting due to the non-conductive region, and in the embodiment, the non-conductive region is defined by the filling layer which is formed of the polymer with metal nanowires 140 having lower concentration than a percolation threshold. In addition, in the second film region 130B, the covers CC cover the sidewalls 122 and the top surface 124 of the metal traces 120 as well as the mentioned embodiments, thereby achieving the protection effect on the metal traces 120. Furthermore, since the filling layer remains between the covers CC over the left first metal trace and the right second metal trace (i.e. the first and second covers), in the present embodiments, the polymer forming the film layer 130 is preferably a non-conductive polymer.

The aforementioned trace structures in FIG. 1E are applied in the fabrication process of a touch panel in the following. The embodiments where the sidewalls 122 and the top surface 124 of the metal traces 120 are covered by covers CC, which include film layer 130 and metal nanowires 140, and the metal traces 120 are protected from being damaged by etchants are further illustrated. It's also noted that the cover CC which includes metal nanowires 140 may be applied to the following touch panel so as to cover the sidewalls 122 and the top surface 124 of the metal traces 120 for protecting the metal traces 120.

Figure 2:
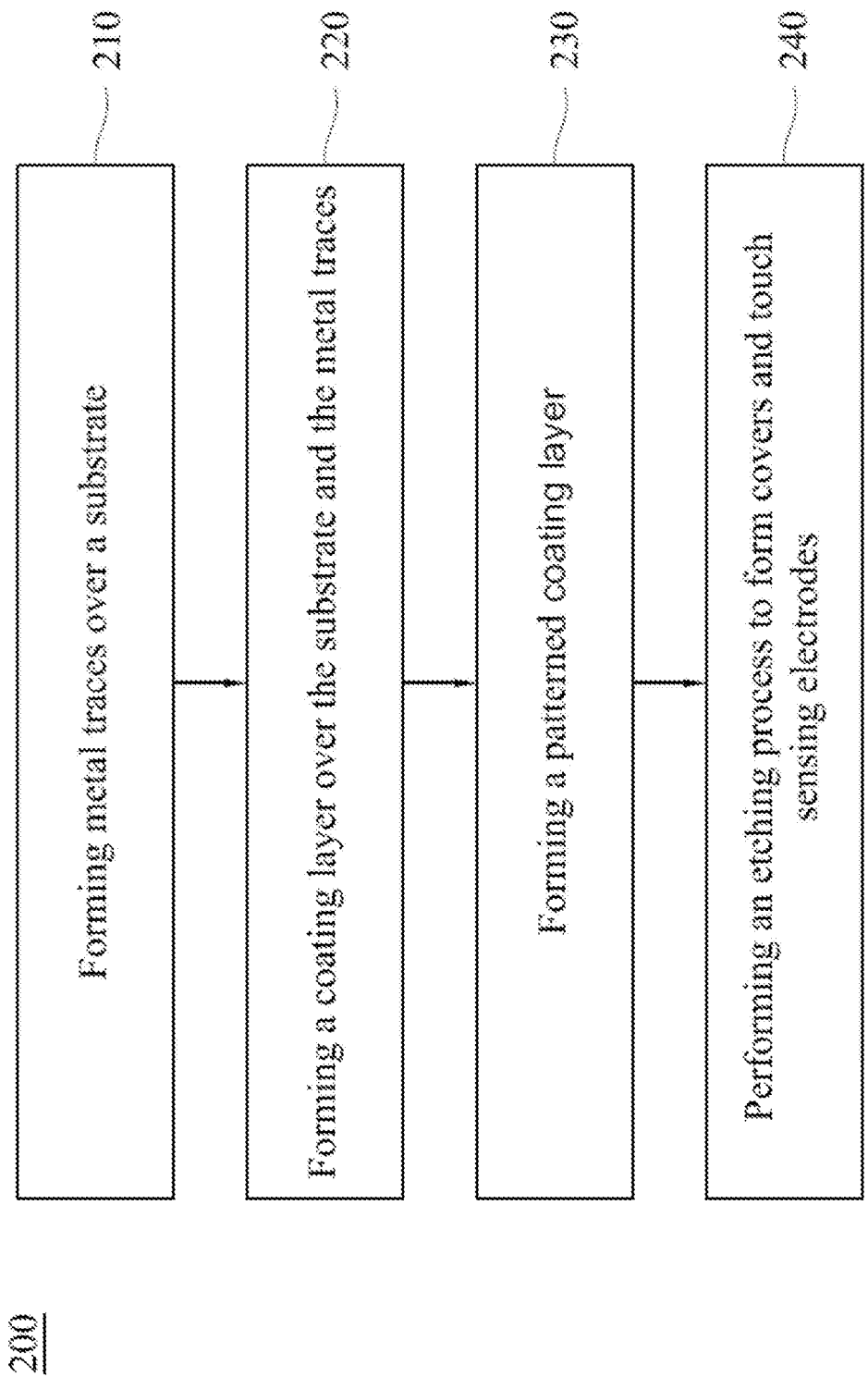
FIG. 2 is a flow chart of a method for fabricating a touch panel according to some embodiments of the present disclosure.

FIG. 2 is a flow chart of a method 200 for fabricating a touch panel according to some embodiments of the present disclosure. FIGS. 3A to 3D are schematic cross-sectional views of a touch panel at plural steps 210-240 according to the method for fabricating the touch panel of FIG. 2.

Figure 3A:
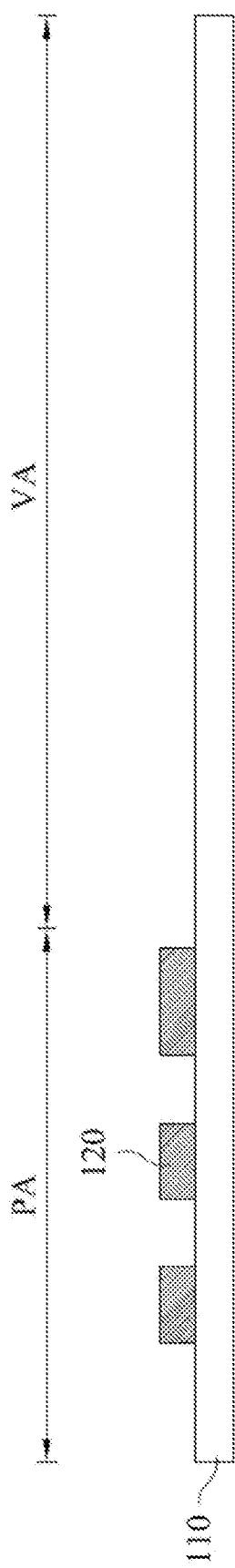
FIGS. 3A to 3D are schematic cross-sectional views of a touch panel at plural steps according to the method for fabricating the touch panel of FIG. 2.

First of all, reference is made to FIG. 2 and FIG. 3A. At the step 210, metal traces 120 are formed over the peripheral area PA of the substrate 110. The exemplary method for forming the metal traces 120 may include: forming a metal layer over the substrate 110; and patterning the metal layer to form the metal traces 120. As aforementioned, the material of the metal traces 120 may be materials having good conductivity, such as silver or copper.

Figure 3B:
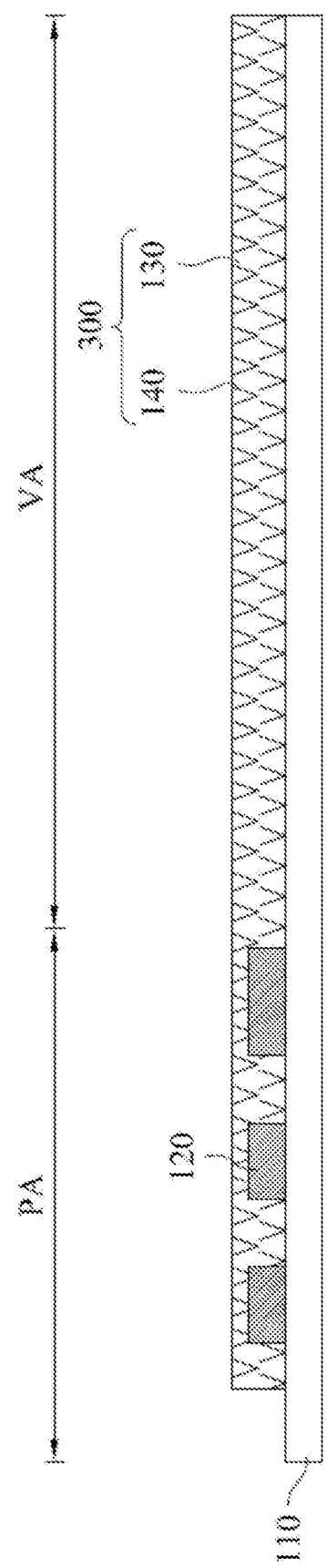

Then, reference is made to FIG. 2 and FIG. 3B. At step 220, a coating layer 300 is formed over the substrate 110 and the metal traces 120. The coating layer 300 may include metal nanowires 140 or includes both of the metal nanowires 140 and the film layer 130. It is worth note that, at this step, the coating layer 300 is formed over the display area VA and the peripheral area PA. The coating layer 300 over the display area VA would form touch sensing electrodes in subsequent steps, and the coating layer 300 over the peripheral area PA would form the covers CC over the metal traces 120.

To be specific, the coating layer 300 is over the substrate 110 and covers the metal traces 120. Since portions of the coating layer 300 are patterned to form the touch sensing electrodes in the display area VA in the subsequent fabrication process, in the present embodiments, it is designed that the composite structure of the film layer 130 and the metal nanowires 140 (i.e., the coating layer 300) have good conductivity and transparency. Similarly, the covers CC formed of the coating layer 300 over the metal traces 120 have good conductivity and transparency as well. For example, the light transmittance of the coating layer 300 is greater than about 80% and the surface resistance is in a range of about 10 $\Omega/\square$ (ohms/square) to 1000 $\Omega/\square$ (ohms/square). Preferably, the light transmittance of the coating layer 300 is greater than about 85%, and the surface resistance of the coating layer 300 is in a range of about 50 $\Omega/\square$ (ohms/square) to about 500 $\Omega/\square$ (ohms/square).

In some embodiments, the metal nanowires 140 and a solvent are mixed up to form the ink or the aforementioned dispersant containing the metal nanowires 140. The ink/dispersant is applied onto the substrate 110 and the metal traces 120. After the ink is solidified and forms a metal nanowire layer, polymers are applied onto the metal nanowire layer. Then, the polymers are cured to form the film layer 130 in or/and over the metal nanowire layer, thereby forming the coating layer 300. In some embodiments, the polymeric material which is used to be cured as the film layer 130 is fluid-phased, such as transparent glue, and can be blended with the ink/dispersant containing the metal nanowires 140. Therefore, the metal nanowires 140 can be directly blended into the polymeric material, and after curing process, the metal nanowires 140 are embedded in the film layer 130. In some embodiments, the solvent of the ink containing the metal nanowires 140 may react with the film layer 130 (e.g., the solvent may dissolve or soften the film layer 130), such that the metal nanowires 140 may penetrate the film layer 130, a so-called swelling process. As a result, the sequence of the fabrication can be adjusted to be: forming the film layer 130, and then coating the ink/dispersant containing the metal nanowires 140 on the film layer 130, such that the film layer 130 is dissolved or softened, and the metal nanowires 140 penetrate into the film layer 130.

In other embodiments, the ink containing the metal nanowires 140 and conductive polymers are blended. Then the mixture of the metal nanowires 140 and conductive polymers are applied onto the substrate 110 and the metal traces 120, and then are solidified to form the coating layer 300.

In some embodiments, the fabrication process of the film layer 130 (e.g. duration of deposition) can be controlled, such that the film layer 130 is thin enough to expose the metal nanowires 140 from the surface of the film layer 130. It is worth note that, for clear illustration, in the cross-sectional views of touch panels of the present disclosure, the metal nanowires 140 are embedded in the film layer 130 and not exposed.

In some embodiments, post-processing may be performed on the formed metal nanowires 140 for enhancing the conductance thereof. The post-processing may include process steps of heating, plasma, corona discharge, UV ozone, pressing treatments or combinations thereof. For example, after the steps of solidifying and forming the metal nanowire layer, a pressure is applied on the metal nanowire layer formed in the display area VA and/or the peripheral area PA by a roller. In an embodiment, the pressure applied on the metal nanowire layer by one or more rollers is in a range of about 50 psi to 3400 psi, preferably in a range of about 100 psi to 1000 psi, about 200 psi to 800 psi, or about 300 psi to 500 psi, and the above step of applying the pressure is preferably performed before the step of coating the film layer 130. In some embodiments, the post-processes of heating and pressing are performed simultaneously or separately. To be specific, the formed metal nanowires 140 are pressed by aforementioned one or more rollers and heated simultaneously. For example, the pressure applied by the roller may be in a range of about 10 psi to 500 psi, preferably in a range of about 40 psi to 100 psi, and at the same time, the roller is heated up to a range of about 70 degrees Celsius to about 200 degrees Celsius, preferably a range of about 100 degrees Celsius to about 175 degrees. After applying the pressure and heat to the metal nanowires 140, the electrical conductivity of the metal nanowires 140 or the composite structure (i.e., coating layer 300) of the metal nanowires 140 and the film layer 130 may be enhanced. In some embodiments, a post-processing may be performed by exposing the metal nanowires 140 to a reducing agent. For example, a post-process may be performed by exposing the metal nanowires 140 which are silver nanowires to a silver reducing agent. The silver reducing agent may include borohydride(e.g. sodium borohydride); boron nitride (e.g. dimethylamine borane (DMAB)); or gas reducing agent (e.g. hydrogen). The exposure duration may be in range of about 10 seconds to 30 minutes, preferably in a range of about 1 minute to 10 minutes.

Figure 3C:
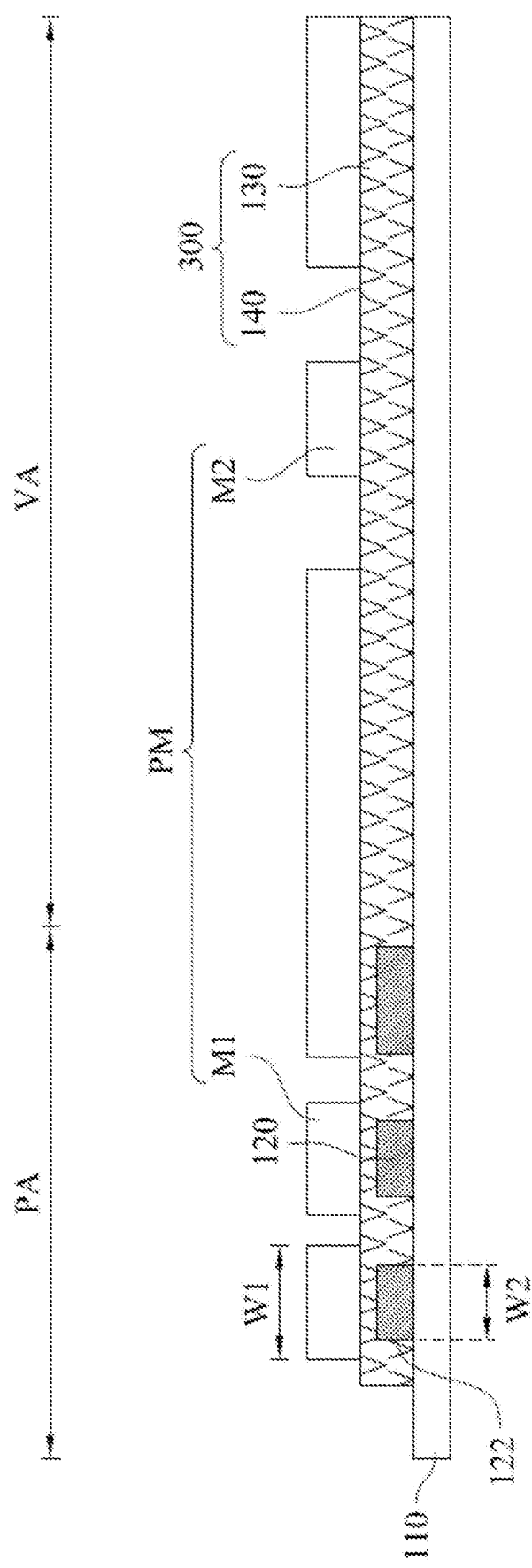

Subsequently, reference is made to FIG. 2 and FIG. 3C. At step 230, a patterned photomask PM is formed over the coating layer 300. The patterned photomask PM has a first patterned photomask M1 corresponding to the peripheral area PA and a second patterned photomask M2 corresponding to the visible region VA. Herein, a size of the pattern of the first patterned photomask M1 is greater than that of the metal traces 120. To be specific, a width W1 of the first patterned photomask M1 over the metal traces 120 is greater than a width W2 of the metal traces 120, such that the sidewalls 122 of the metal traces 120 are fully covered by the first patterned photomask M1. The second patterned photomask M2 is utilized to define a pattern of touch sensing electrodes (e.g. the touch electrodes TE and the connecting electrodes CE) to be formed in subsequent processes. Preferably, without considering the fabrication tolerance, the width W1 may be about 110% to 130% of the width W2.

The patterned photomask PM may be made of a positive photoresist or a negative photoresist. For example, the patterned photomask PM may be formed of a dry film photoresist. The dry film photoresist may be coated over the coating layer 300 by a roller, and then the coated dry film photoresist is processed by exposure and development (i.e., lithograph) process, such that the dry film photoresist is patterned into the patterned photomask PM.

Figure 3D:
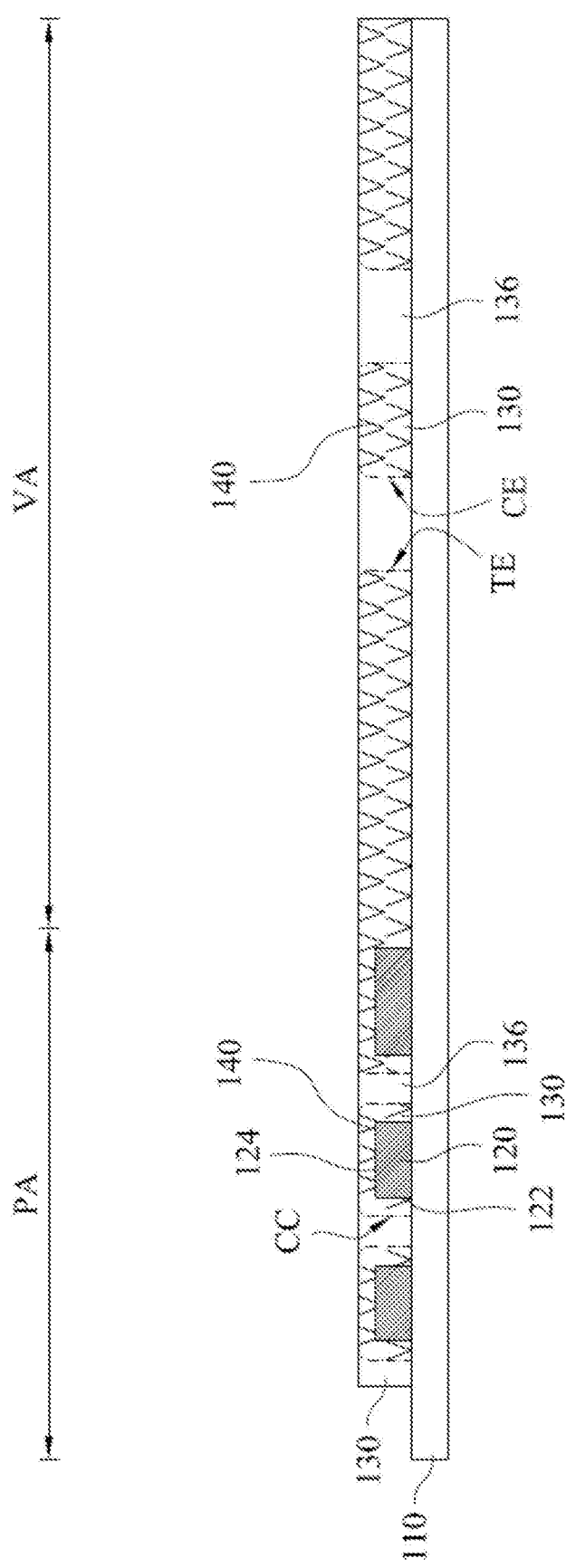

Reference is made to FIG. 2 and FIG. 3D. At step 240, the metal nanowires 140 in the coating layer 300 uncovered by the patterned photomask PM are etched, using the patterned photomask PM as an etch mask, such that the covers CC in the peripheral area PA and touch sensing electrodes (i.e., the touch electrodes TE and the connecting electrodes CD) in the visible region VA are formed. In the etching operation of the step 240, the coating layer 300 in the visible region VA would be etched according to the pattern of the aforementioned second patterned photomask M2 by an etchant (i.e., nitric acid, phosphoric acid, hydrochloric acid, acetic acid, the combination thereof, or other suitable etchant), thereby defining a pattern of touch sensing electrodes (i.e., the touch electrodes TE and the connecting electrodes CE) and non-conductive regions 136. In other words, after etching, the metal nanowires 140 and the portion of the film layer 130 in the visible region VA integrally form the touch sensing electrodes. At the same time, the coating layer 300 in the peripheral area PA is etched according to the pattern of the aforementioned first patterned photomask M1 by the etchant, thereby forming the covers CC and the non-conductive regions 136 between the neighboring covers CC. The metal nanowires 140 and the portion of the film layer 130 in the peripheral area PA integrally form the covers CC. The covers CC can cover the sidewalls 122 and the top surfaces 124 of the metal traces 120. For example, when the metal nanowires 140 are silver nanowires, the etchant may be selected to be phosphoric/hydrochloric acid. Alternatively, in other embodiments, the etchant may be selected to be nitric acid, phosphoric acid, hydrochloric acid, the combination thereof, or other suitable material. The etchant removes the metal nanowires 140 in the coating layer 300 uncovered by the patterned photomask PM. Since it is not easy for the etchant to etching the film layer 130, the transparent film layer 130 is not removed and remains. As a result, the coating layer 300 uncovered by the patterned photomask PM may form the non-conductive regions 136 that is less conductive or non-conductive, in both of the visible region VA and the peripheral area PA. Similar to the aforementioned first film region 130A, the non-conductive regions 136 also have an insulating effect. For Example, the non-conductive region 136 in the peripheral area PA electrically insulates the covers CC formed on the adjacent metal traces 120, and the non-conductive region 136 in the display area VA electrically insulates adjacent touch electrodes TE. The coating layer 300 covered by the patterned photomask PM may form the covers CC (in the peripheral area PA), the touch electrodes TE (in the visible region VA), and the connecting electrodes CE (in the visible region VA), which have a good conductivity.

It is worth note that, in some embodiments of the present disclosure, the covers CC cover the sidewalls 122 and the top surface 124 of the metal traces 120, so as to preventing the metal traces 120 from being effected or etched by the etchant. In some embodiments of the present disclosure, the etchant is mainly having phosphoric acid or hydrochloric acid. A ratio of the etching rates of the phosphoric acid or hydrochloric acid to the metal traces 120 and the composite structures of the film layer 130 and the metal nanowires 140 is about in a range to 100:1 to 20:1. In other words, if the sidewalls 122 and the top surface 124 of the metal traces 120 are not covered by the covers CC, the metal traces 120 would be destroyed in the process of etching the touch electrodes TE and the connecting electrodes CE by the etchant, and problems, such as side etching or rough etched surface of the metal traces 120, may occur. Therefore, the trace structures of the embodiments of the present disclosure takes the covers CC as etch-stop layers, such that the touch panels including the aforementioned trace structures show well reliability. For example, the metal traces 120 has uniform surface flatness, such that there is less difference among the resistances of the metal traces 120, and during the etching process, it is less likely that the metal traces 120 have defects resulted from side etching, such as broken, crack, and so on.

At the step 240, the structure illustration is finished, in which the covers CC formed of a second portion of the film layer 130 (i.e., the portion of the film layer 130 in the peripheral area PA) and the metal nanowires 140 covers the metal traces 120 so as to prevent the metal traces 120 from being etched by the etchant, and the metal nanowires are embedded in a first portion of the film layer (i.e., the portion of the film layer 130 in the display area VA) to integrally form the touch sensing electrode. In the embodiment, the covers CC formed of the film layer 130 and the metal nanowires 140 fully covers the metal traces 120, as the disclosure mentioned in the embodiment of FIG. 1D. However, there may be some following steps for display area VA. For example, the steps of forming insulators 164 and bridging wires 162 (referring to FIG. 4) in the fabrication process of touch sensing electrodes, but it is not the major point of the embodiments of the present disclosure, and therefore detail steps of the fabrication process of the touch sensing electrodes is omitted herein.

In some embodiments, the steps 210 to 240 may be performed with the roll-to-roll process, which shows high production. The roll-to-roll coating process uses known instruments and can be fully automated, therefore lowering costs of the fabrication process of the touch panels. The roll-to-roll coating process may include: providing a substrate 110 having flexibility; arranging the substrate 110 onto two rollers, e.g., a feeding roller and a rear-end roller; and driving the two rollers with a motor, such that the substrate 110 is processed continuously along the moving path between the two rollers. For example, at a first platform, the aforementioned step 210 is performed, and the metal traces 120 are formed over the peripheral area PA of the substrate 110. Subsequently, the substrate 110 proceeds to a second platform, which may include a storage tank, a spray device, a coating device, or the like. The ink including the metal nanowires 140 is disposed onto the surface of the substrate 110 and the metal nanowires 140, thereby forming the metal nanowires 140 in the second platform. Then, the substrate 110 proceeds to a third platform, which has devices similar to the second platform. The third platform is mainly disposing polymer onto the metal traces 120, and curing the polymer to form the film layers 130, so as to form the coating layer 300. To be brief, the aforementioned step 220 is performed at the second and third platforms. Then, the substrate 110 proceeds to a fourth platform, mainly including lithography or photography apparatus. A patterned mask PM is applied on the coating layer 300 (referring to the step 230). Then, the substrate 110 proceeds to a fifth platform, mainly including an etch apparatus, so as to performed the aforementioned etching step in step 240. Finally, the products of touch panels are rolled out through the rear-end roller. The steps in the roll-to-tolll production line may be adjusted according to various requirements along the moving paths of the substrate. Additional platforms may be adopted. For example, for achieving the post-treatment process, pressure rollers or plasma apparatus may be arranged into the production line.

Figure 4:
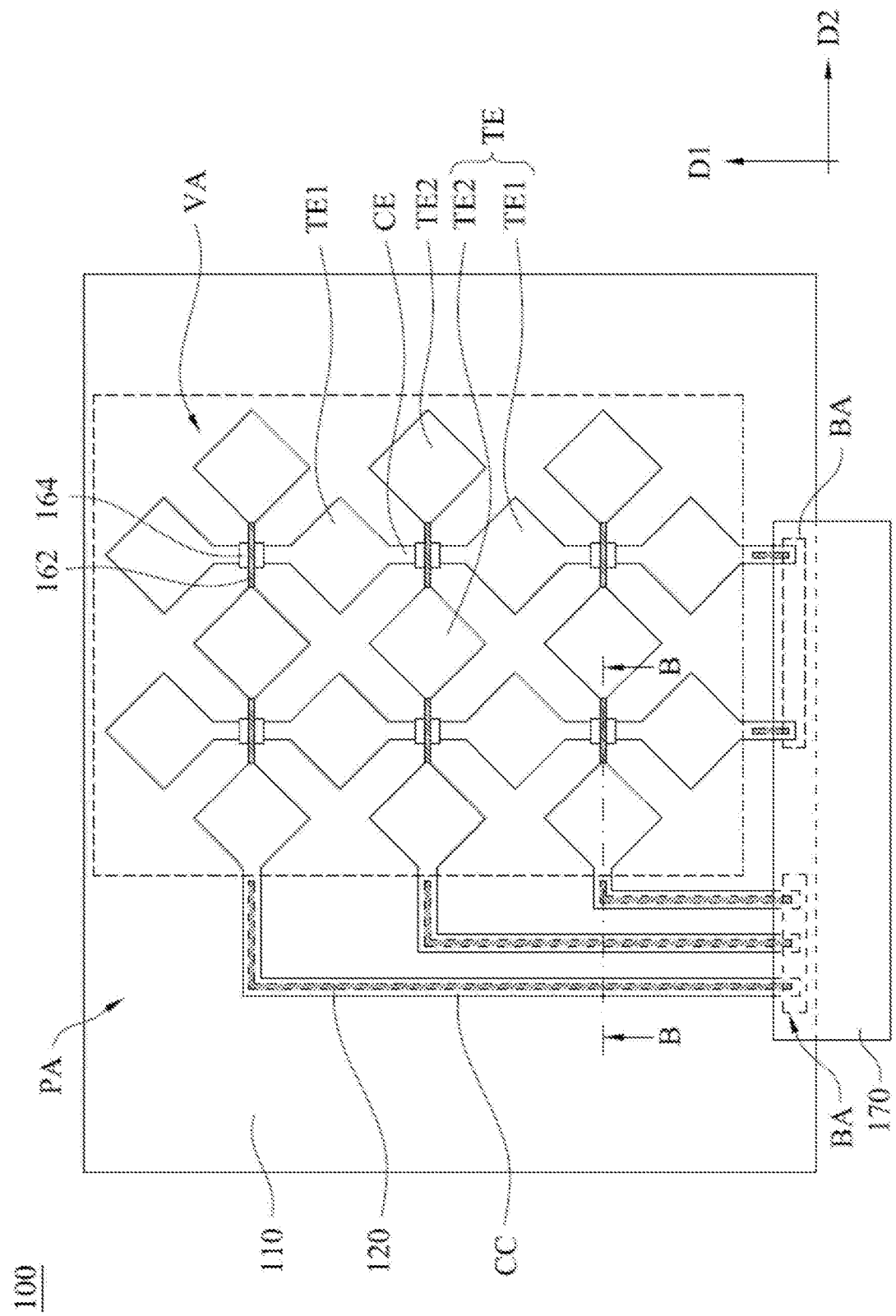
FIG. 4 is a schematic top view of a touch panel according to some embodiments of the present disclosure.

FIG. 4 is a schematic top view of a touch panel according to some embodiments of the present disclosure. In some embodiments of the present disclosure, since the touch sensing electrodes and the covers CC are both the conductive composite structures of the film layer 130 and the metal nanowires 140, the touch sensing electrodes may be electrically connected to the metal traces 120 through the covers CC that is formed on and in contact with the metal traces 120. As shown in FIG. 4, the vertical electrodes (i.e. the electrodes extending along the first direction D1 and formed of the touch electrodes TE1 and the connecting electrodes CE) are electrically connected to the metal traces 120 on a bottom side of the display area VA, and the horizontal electrodes (i.e. the electrodes extending along the second direction D2 and formed of the touch electrodes TE2 and the bridging wires 162) are electrically connected to the metal traces 120 on a left side of the display area VA.

Figure 4A:
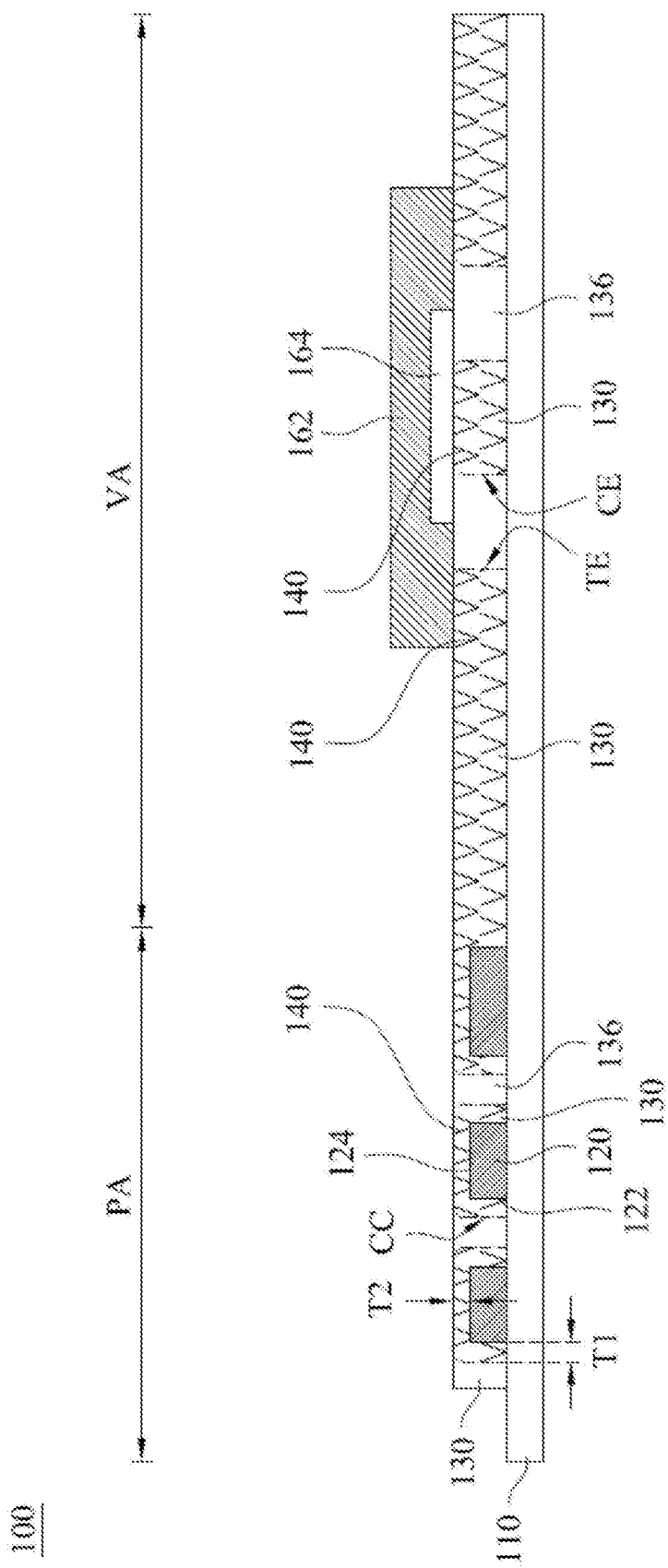
FIG. 4A is a schematic cross-sectional view taken along line B-B of FIG. 4.

FIG. 4A is a schematic cross-sectional view taken along line B-B of FIG. 4. In some embodiments, the covers CC has a first portion, which has a first thickness T1, formed on the sidewalls 122 of the metal traces 120, the covers CC has a second portion, which has a second thickness T2, formed on the top surface 124 of the metal traces 120, and the second thickness T2 may be thinner than the first thickness T1. For example, the first thickness T1 may be in a range of about 2 micrometers to about 30 micrometers, such as 5 micrometers. The second thickness T2 may be in a range of about 30 nanometers to about 100 nanometers, preferably 50 nanometers to about 100 nanometers, more preferably 90 nanometers.

In some embodiments of the present disclosure, in order to prevent from short circuit between the adjacent metal traces 120 or the touch electrodes TE1 and TE2, the touch panel 100 further includes non-conductive regions 136 over the peripheral area PA and the display area VA. As the example in FIG. 4A, the non-conductive regions 136 has a filing layer, which is made of the same polymeric material as that of the film layer 130. In some embodiments, the conductivity of the non-conductive regions 136 is lower than the conductivity of the touch electrodes TE and/or the covers CC. To be specific, the filling layers of the non-conductive regions 136 are portions of the film layer 130, and the concentration of the metal nanowires 140 therein is zero. Therefore, in the embodiments of FIG. 4, the characteristics of the non-conductive regions 136 may be referred to those describing the first film regions 130A of FIG. 1D. That is, in the present embodiments, the non-conductive regions 136 are formed of the filling layers that do not contain the metal nanowires 140. The details of the present embodiments are similar to those illustrated before, and not repeated herein.

As such, through the configuration of the non-conductive regions 136, different columns or different lines of the touch electrodes TE are electrically isolated from each other, and electrical isolation are also formed between the adjacent metal traces 120, thereby achieving the electrical configuration of the touch panel 100.

In some embodiments of the present disclosure, the substrate 110 is ideally a transparent substrate. To be specific, the substrate 110 may be a rigid transparent substrate or a flexible transparent substrate. The material of the substrate 110 may be selected from glass, polymethylmethacrylate (PMMA), polyvinyl Chloride (PVC), polypropylene (PP), polyethylene terephthalate (PET), polyethylene naphthalate (PEN), polycarbonate (PC), polystyrene (PS), or other transparent materials.

In some embodiments of the present disclosure, the material of the metal traces 120 may be conductive materials, such as silver, copper, and so on. In some embodiments of the present disclosure, the film layer 130 is formed of insulating materials. For example, the materials of the film layer 130 may be non-conductive epoxy or other organic materials. In some embodiments of the present disclosure, the film layer 130 may be formed by spin-coating, spraying, printing, or other methods. In some embodiments, the film layer 130 has a thickness ranging from about 20 nanometers to about 10 micrometers, about 50 nanometers to about 200 nanometers, or about 30 nanometers to about 100 nanometers. For example, the thickness of the film layer 130 is about 90 nanometers or about 100 nanometers.

In some embodiments of the present disclosure, the metal nanowires 140 may be silver nanowires or silver nanofibers, which have an average diameter ranging from about 20 nanometers to about 100 nanometers and an average length ranging from about 20 micrometers to about 100 micrometers. Preferably, the average diameter ranges from about 20 nanometers to about 70 nanometers, and an average length ranges from about 20 micrometers to about 70 micrometers. The aspect ratio may be 1000. In some embodiments, the diameter of the metal nanowires 140 may range from 70 nanometers to 80 nanometers, and the length of the metal nanowires 140 is about 8 micrometers.

When the metal nanowires 140 are added/mixed into the film layer 130, the film layer 130 is thin enough to exposing the metal nanowires 140 from the film layer 130 in some embodiments. For example, the thickness of the film layer 130 is less than 90 nanometers. As such, in a subsequent step (i.e., a bonding step) to connect an external circuit board (e.g. a flexible printed circuit board 170) to metal traces 120 of the touch panel 100, the exposed metal nanowires 140 build a conductive path between the flexible printed circuit board 170 and the metal traces 120. There is no need to form via holes in the covers CC over metal traces 120 in a bonding area BA. In alternative embodiments, via holes may be formed in the covers CC over metal traces 120 in the bonding area BA and filled with conductive materials, and then the flexible printed circuit board 170 is bonded with the conductive materials in the bonding step.

In some embodiments of the present disclosure, the touch electrodes TE are a single-layered configuration, and the touch electrodes TE are arranged in a crisscross pattern of lines and columns. Herein, the exemplary touch electrodes TE have a diamond shape. However, in some other embodiments, it should not limit the scope of the present disclosure, and the touch electrodes TE may have other suitable shapes. Herein, for clear illustration, the touch electrodes TE1 and the touch electrodes TE2 are used in the configuration of the present embodiments. In some embodiments, the touch electrodes TE1 and the touch electrodes TE2 are configured to transmit control signals and receive touch-sensing signals respectively.

To be specific, one of the connecting electrodes CE connects adjacent touch electrodes TE1 to each other in the first direction D1. The connecting electrodes CE and the touch electrodes TE are made of the same material, and therefore the connecting electrodes CE and the metal traces 120 have different etch resistance.

Through the configuration, the touch electrodes TE, the covers CC, and the connecting electrodes CE include the same material. To be specific, the touch electrodes TE, the covers CC, and the connecting electrodes CE are mode of the same composite structure that includes the film layer 130 and the metal nanowires 140 therein, and the concentration of the metal nanowires 140 is higher than the percolation threshold, such that the metal nanowires 140 form a conductive network achieving the touch sensing function. Preferably, the aforementioned post-processes may be performed to the metal nanowires 140 for enhancing the conductivity of the touch electrodes TE and the connecting electrode CE so as to improve the quality of the transmission of electrical signals of the product.

Furthermore, the touch panel 100 further includes bridging wires 162 and insulators 164. The bridging wire 162 connects two adjacent touch electrodes TE2 in the second direction D2. The insulators 164 are disposed between the connecting electrodes CE and the bridging wires 162 and separating the connecting electrodes CE from the bridging wires 162, such that the touch electrodes TE1 are electrically isolated from the touch electrodes TE2.

As such, by detecting variations between the signals of the touch electrodes TE1 and TE2 (e.g., the capacitance variation), touch positions may be obtained. Through the configuration, the user may touch various positions on the substrate 110 and the touched position can be sensed.

In some embodiments of the present disclosure, the bridging wires 162 may be made of suitable conductive material, such as copper. The insulators 164 may be made of suitable insulating material, such as silicon dioxide. In some embodiments, the configuration of the touch panel 100 is exemplarily illustrated with the insulators 164. In some other embodiments, the bridging wires 162 and an insulation layer (not shown) may be adopted, and the bridging wires 162 may connect the touch electrodes TE2 through the openings (not shown) of the insulation layer. The configuration should not limit the scope of the present disclosure.

Herein, the present embodiments are exemplarily illustrated by disposing the connecting electrodes CE between the substrate 110 and the bridging wires 162, but it should not limit the scope of the present disclosure. In some other embodiments, the bridging wires 162 may be disposed between the substrate 110 and the connecting electrodes CE.

In some embodiments of the present disclosure, the touch panel 100 further includes a flexible printed circuit board 170, the metal traces 120 and the covers CC may extend from the display area VA to the bonding area BA in the peripheral area PA, and at least a portion of the metal traces 120 and the covers CC are formed in the bonding area BA. Through the configuration, the electrode pads (not shown) of the flexible printed circuit board 170 may electrically connect the metal traces 120 and the covers CC in the bonding area BA through conductive adhesives (not show, i.e. anisotropic conductive glue).

Herein, since the covers CC covers the metal traces 120, and the metal nanowires 140 are exposed out of the surface of the covers CC, in some embodiments, the conductive adhesives (i.e. anisotropic conductive glue) may be electrically connected with the metal traces 120 through the exposed metal nanowires 140 and the conductive network formed of the metal nanowires 140, in which the conductive adhesive is not required to be in direct contact with the metal traces 120. In some embodiments, the covers CC in the bonding area BA may have one or more openings exposing the metal traces 120, and the conductive adhesives (i.e. anisotropic conductive glue) may fill the opening of the covers CC so that conductive adhesive is in direct contact with the metal traces 120, and thereby forming the conductive path between the metal traces 120 and the flexible printed circuit board 170.

As such, the trace structure (including the metal trace 120 and the covers CC) of the present embodiments may extend to the bonding area BA and be electrically connected to the flexible printed circuit board 170.

Figure 5:
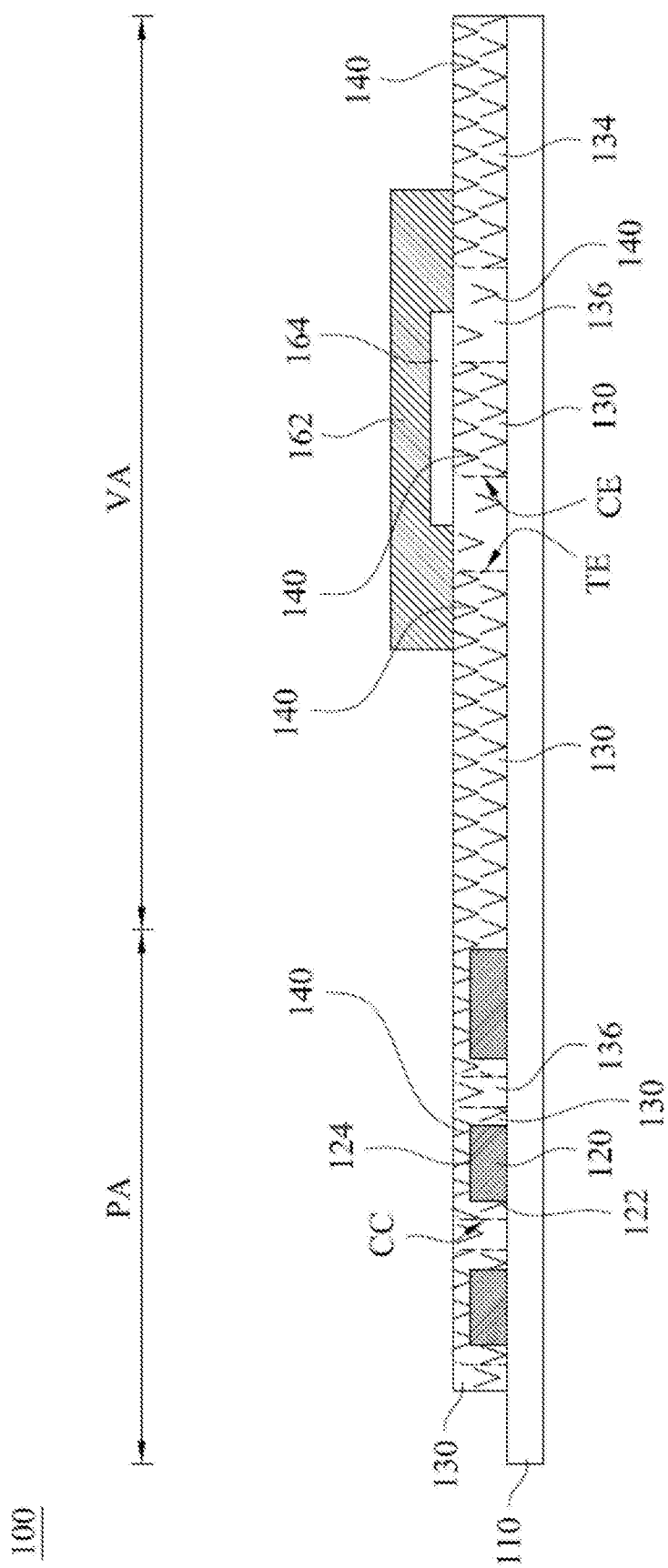
FIG. 5 is a schematic cross-sectional view of a touch panel according to some embodiments of the present disclosure.

FIG. 5 is a schematic cross-sectional view of a touch panel 100 according to some embodiments of the present disclosure. The present embodiments are similar to that of FIG. 4A. The difference between the present embodiments and that of FIG. 4A is mainly and at least that: in the present embodiments, the metal nanowires 140 are in the filling layer of the non-conductive regions 136.

In the present embodiments, in the display area VA and the peripheral area PA, a concentration of the metal nanowires 140 in the non-conductive regions 136 is lower than a percolation threshold, such that the metal nanowires 140 do not form a conductive network. Therefore, the whole non-conductive region 136 is insulating.

Herein, the concentration of the metal nanowires 140 in the non-conductive regions 136 is adjusted to low enough to prevent from conductive paths being formed between the adjacent covers CC, the adjacent touch electrodes TE1 and TE2, or between the adjacent touch electrodes TE2 and the connecting electrodes CE. In other words, although the filling layers in the non-conductive regions 136 include the metal nanowires 140 in low concentration (e.g., lower than the percolation threshold), the non-conductive regions 136 have an electrical insulating effect. Other details of the present embodiments are similar to those illustrated in the description of FIG. 1E, and not repeated herein. It is worth note that adding the low-concentration metal nanowires 140 to the non-conductive regions 136 may make the non-conductive regions 136 have similar optical properties to those of the conductive regions (i.e., the touch electrodes TE and the connecting electrodes CE). For example, the difference between the refractive indexes of the non-conductive regions 136 and that of the conductive regions (i.e., the touch electrodes TE and the connecting electrodes CE) are reduced by adding the low-concentration metal nanowires 140 to the non-conductive regions 136. Therefore, when users view the display, the screen shows more uniform displaying performance. That is, it is less likely for users to visually notice the boundary or lines between the non-conductive regions 136 and the conductive regions.

In some embodiments of the present embodiments, the film layer 130 is formed of insulating materials. For example, the materials of the film layer 130 may be non-conductive polymer or other organic materials. Other details of the present embodiments are similar to those illustrated in the aforementioned embodiment, and thereto not repeated herein.

Figure 6:
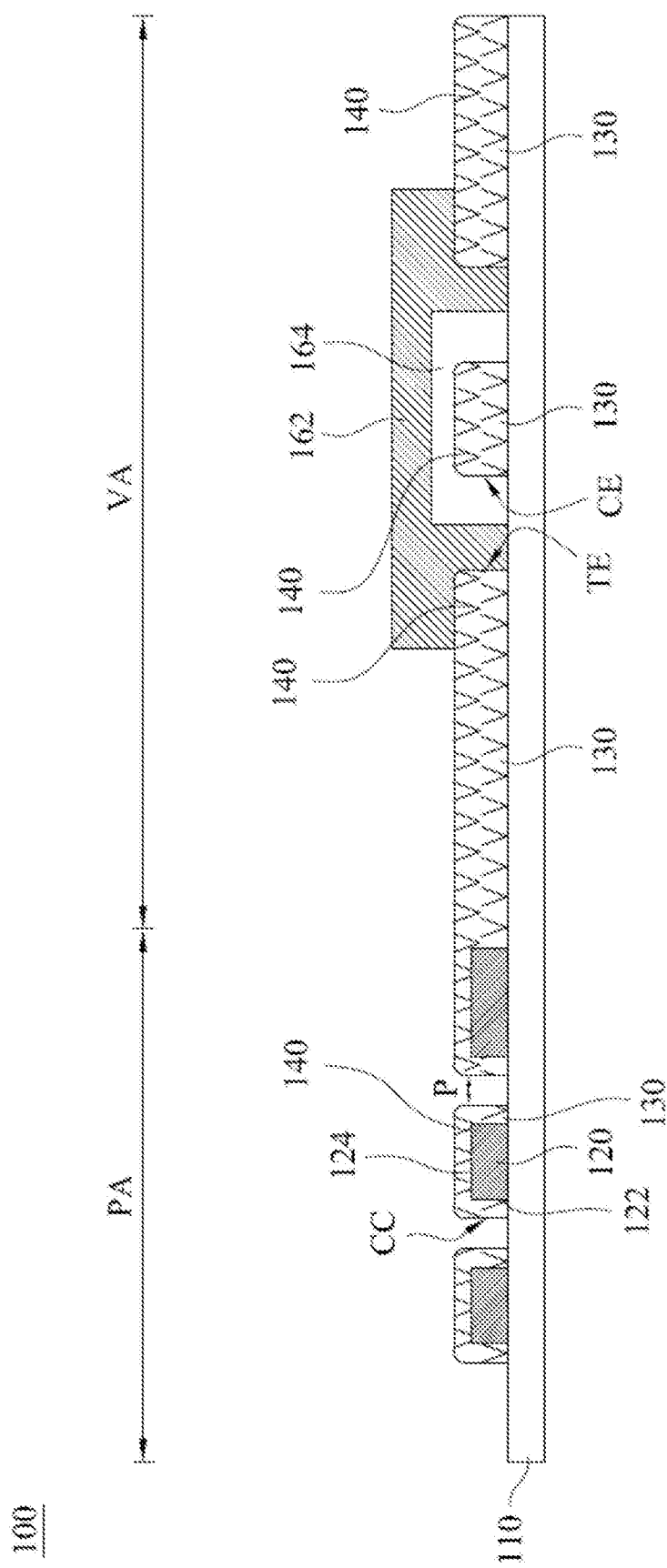
FIG. 6 is a schematic cross-sectional view of a touch panel according to some embodiments of the present disclosure.

FIG. 6 is a schematic cross-sectional view of a touch panel 100 according to some embodiments of the present disclosure. The difference between the present embodiments and that of FIG. 4A is mainly and at least that: the present embodiments, the film layer 130 or the filling layer is not formed between the adjacent covers CC, the adjacent touch electrodes TE1 and TE2, or the adjacent touch electrodes TE2 and the connecting electrodes CE. To be specific, in the peripheral area PA, the covers CC have gaps P therebetween, and there are also gaps P between the touch electrodes TE1 and TE2 or the touch electrodes TE2 and the connecting electrodes CE in the display area VA. The function of the gaps P is the same as the non-conductive regions 136 of the aforementioned embodiments, in which the gaps P may prevent from short circuit between the electrodes or the traces.

Other details of the present embodiments are similar to those of aforementioned embodiments, as the description of FIG. 1A or 1C, and not repeated herein. It is worth noting that due to the non-conductive regions 136 of the film layer 130 have the gaps P to physically separate the electrodes or the traces, the film layer 130, which forms the touch sensing electrodes and/or the covers CC, may be made of conductive polymer, such the composite structures of the metal nanowires 140 and the film layer 130 have good conductivity, thereby improving the quality of the transmission of the electrical signals of the touch sensing electrodes.

In the above embodiments, when an etchant including phosphoric/hydrochloric acid is used in the etching process during the formation of the touch electrodes TE and connecting electrodes CE, the covers CC, which cover the metal traces 120, has a higher etch resistance to the etchant including phosphoric/hydrochloric acid than that of the metal traces 120, therefore the metal traces 120 are prevented from being destroyed by the etchant.

In some embodiments of the present disclosure, a first patterned mask M1 over the metal traces 120 has a width greater than that of the metal traces 120. Through the configuration, in the etching process, the coating layer 300 including the metal nanowires 140 is maintained and blanked over the sidewalls 122 and the top surfaces 123 of the metal traces 120, thereby protecting the surfaces of the metal nanowires 140 from being etched. The composite structures of the metal nanowires 140 and the coating layer 300 over the metal traces 120 are referred to the aforementioned covers CC which fully covers the metal traces 120. In some embodiments, the covers CC partially cover the metal traces 120, e.g. at least 80% of an area of the exposed surface of each metal trace 120 is covered.

Figure 7:
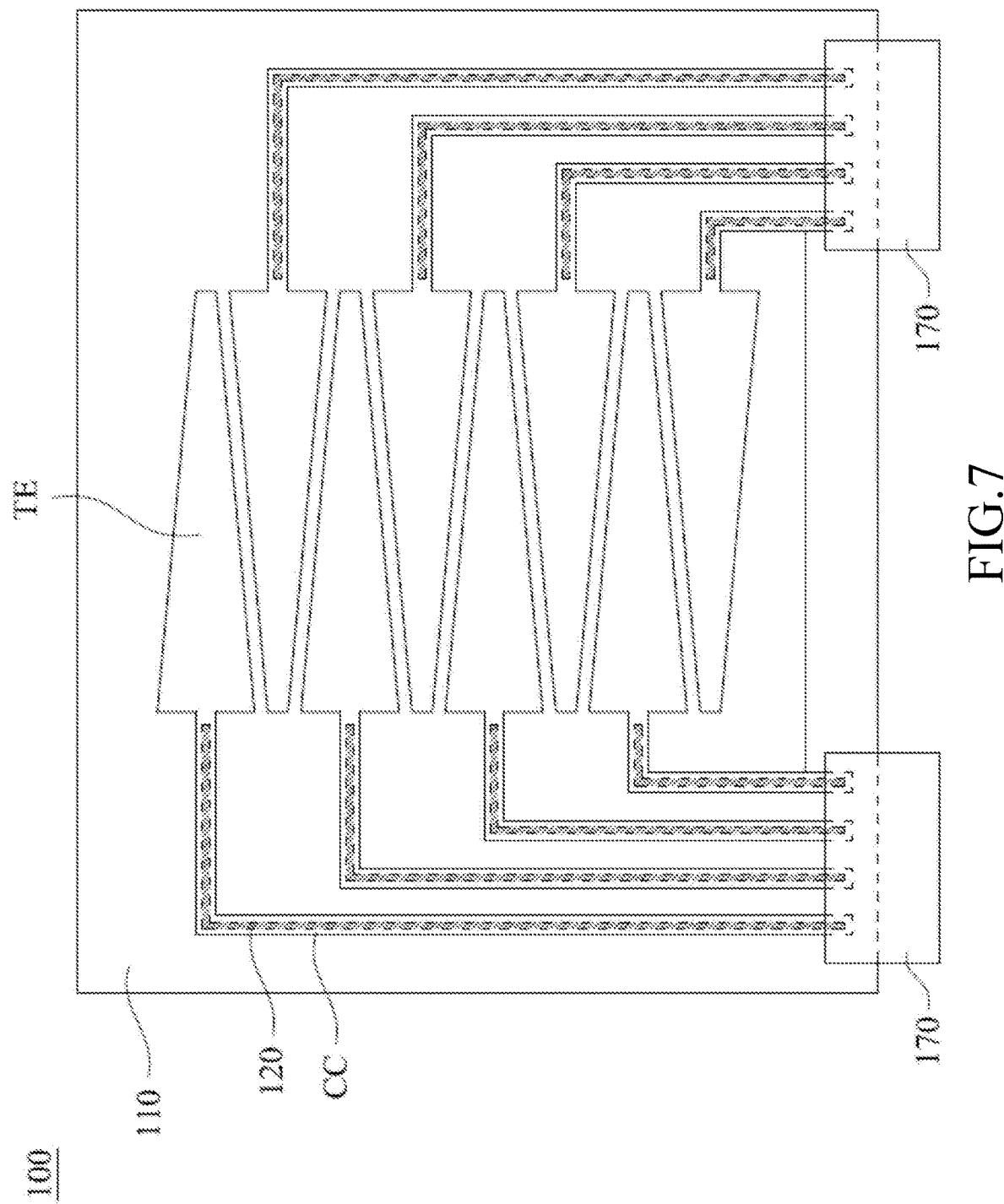
FIG. 7 is a schematic top view of a touch panel according to some embodiments of the present disclosure.

FIG. 7 is a schematic top view of a touch panel 100 according to some embodiments of the present disclosure. The present embodiments are similar to that of FIG. 1. The difference between the present embodiments and that of FIG. 1 is mainly and at least that: the present embodiments, the touch electrodes TE are not arranged in the crisscross pattern. For example, in the present embodiments, the touch electrodes TE are plural striped electrodes extending in a direction, e.g., the first direction D1, and there are no bridging wires 162 and insulators 164. In the present embodiments, the touch electrodes TE are a single-layered configuration, and the touch position may be obtained by detecting the variation of self-capacitance of the respective touch electrodes TE.

Other details of the present embodiments are similar to aforementioned embodiments, and therefore not repeated herein.

Figure 8:
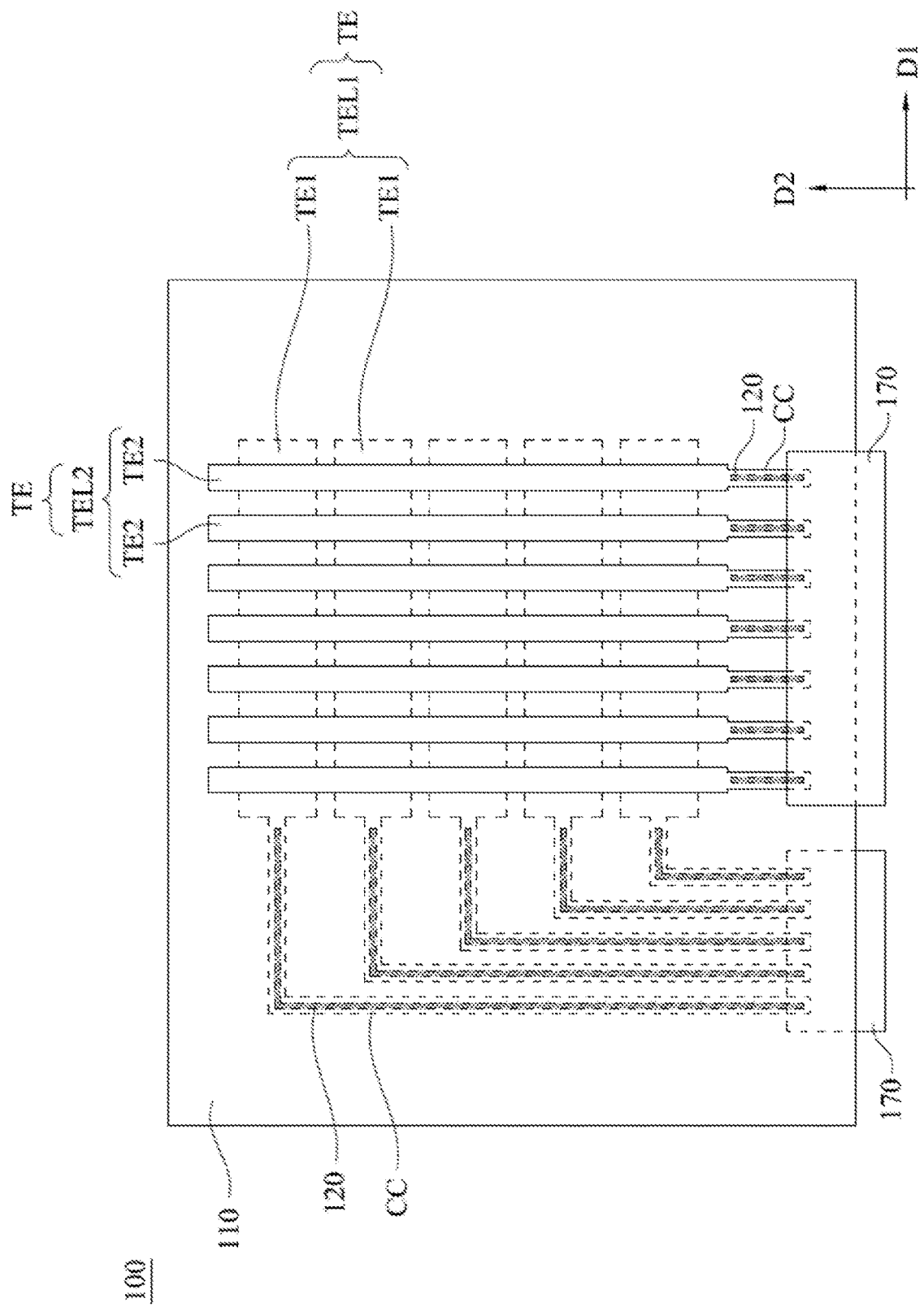
FIG. 8 is a schematic top view of a touch panel according to some embodiments of the present disclosure.

FIG. 8 is a schematic top view of a touch panel 100 according to some embodiments of the present disclosure. The present embodiments are similar to that of FIG. 1. The difference between the present embodiments and that of FIG. 1 is mainly and at least that: the present embodiments, the touch electrodes TE are a double-layered configuration.

For clear illustration, a touch electrode layer TEL1 and a touch electrode layer TEL2 are used for illustrating the present embodiments. The touch electrode layer TEL1 is formed over a surface of the substrate (e.g. the bottom surface), and the touch electrode layer TEL2 is formed over the other surface of the substrate (e.g. the top surface), such that the touch electrode layers TEL1 and TEL2 are electrically isolated from each other. The touch electrode layer TEL1 has plural striped touch electrodes TE1 extending in the first direction D1, and the touch electrode layer TEL2 has plural striped touch electrodes TE2 extending in the second direction D2. The metal traces 120 and the covers CC connecting the touch electrodes TE1 are formed over the bottom surface of the substrate correspondingly. Similarly, the metal traces 120 and the covers CC connecting the touch electrodes TE2 are formed over the top surface of the substrate correspondingly. The striped touch electrodes TE1 extends in a direction different from that of the touch electrodes TE2, and therefore the touch electrodes TE1 and TE2 are intersected.

In some embodiments, by detecting signal variation of the touch electrodes TE1 and TE2 (e.g., the capacitance variation between touch electrodes TE1 and TE2), the touch positions are obtained.

Other details of the present embodiments are similar to aforementioned embodiments, and therefore not repeated herein.

In some embodiments of the present disclosure, the metal traces are designed to be covered by at least the covers formed of metal nanowires. Through the configuration, the exposed surfaces of the metal traces are protected from being damaged during the step of etching the coating layer containing the metal nanowires to form the electrodes.

In some embodiments of the present disclosure, the covers formed of metal nanowires are conductive. In the condition that the open circuit resulted from broken metal traces occurs, the conductive covers on the metal traces may provide a secondary current path for solving the problem of open circuit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A trace structure, comprising:
    a substrate;
    a first metal trace disposed on a peripheral area of the substrate, wherein the first metal trace has a sidewall, a bottom surface, and a top surface diametrically opposite the bottom surface; and
    a first cover disposed on the peripheral area of the substrate and covering the sidewall and the top surface of the first metal trace, wherein:
        the first cover is not disposed between the bottom surface of the first metal trace and the substrate,
        the first cover comprises metal nanowires,
        the first cover and the first metal trace have different etch resistances due to a material composition of the first cover having a first etch rate to an etchant and a material composition of the first metal trace having a second etch rate to the etchant,
        the first metal trace comprises a material different from the metal nanowires,
        the metal nanowires have a first etch resistance to the etchant,
        the material of the first metal trace has a second etch resistance to the etchant, and
        the first etch resistance is higher than the second etch resistance.

2. The trace structure of claim 1, wherein the first cover further comprises:
    a film layer covering the sidewall and the top surface of the first metal trace, wherein the metal nanowires are embedded in the film layer to integrally form the first cover.

3. The trace structure of claim 2, wherein the metal nanowires protrude from a surface of the film layer.

4. The trace structure of claim 2, wherein:
    a first portion of the first cover on the sidewall of the first metal trace has a first thickness, a second portion of the first cover on the top surface of the first metal trace has a second thickness, and the second thickness is thinner than the first thickness.

5. The trace structure of claim 2, further comprising:
a second cover; and
a second metal trace disposed on the peripheral area of the substrate, wherein:
   a sidewall and a top surface of the second metal trace are covered by the second cover,
   the second cover is formed by the metal nanowires and the film layer,
   the second metal trace comprises the material different from the metal nanowires and comprises a material different from the film layer,
   the second cover has a third etch resistance to the etchant,
   the third etch resistance is higher than the second etch resistance,
   a non-conductive region is defined between the first cover and the second cover to electrically insulate the first cover from the second cover, and
   a filling layer having the material of the film layer is disposed in the non-conductive region.

6. The trace structure of claim 5, wherein a concentration of the metal nanowires in the filling layer is zero.

7. The trace structure of claim 5, wherein:
the metal nanowires are embedded in the filling layer, and
a concentration of the metal nanowires embedded in the filling layer is less than a percolation threshold, such that the metal nanowires embedded in the filling layer form a non-conductive network.

8. The trace structure of claim 2, further comprising:
a second cover; and
a second metal trace disposed on the peripheral area of the substrate, wherein:
   a sidewall and a top surface of the second metal trace are covered by the second cover,
   the second cover is formed by the metal nanowires and the film layer,
   the second metal trace comprises the material different from the metal nanowires and comprises a material different from the film layer,
   the second cover has a third etch resistance to the etchant,
   the third etch resistance is higher than the second etch resistance,
   a non-conductive region is defined between the first cover and the second cover to electrically insulate the first cover from the second cover, and
   the non-conductive region comprises a gap through which a top surface of the substrate is exposed.

9. The trace structure of claim 8, wherein the material of the film layer is a conductive polymer or a non-conductive polymer.

10. The trace structure of claim 1, further comprising:
a second cover; and
a second metal trace disposed on the peripheral area of the substrate, wherein:
   a sidewall and a top surface of the second metal trace are covered by the second cover,
   the second cover comprises the metal nanowires,
   the second metal trace comprises the material different from the metal nanowires,
   the second cover has a third etch resistance to the etchant,
   the third etch resistance is higher than the second etch resistance,
   a non-conductive region is defined between the first cover and the second cover to electrically insulate the first cover from the second cover, and
   the non-conductive region comprises a gap.

11. A touch panel, comprising:
a substrate having a display area and a peripheral area;
a plurality of metal traces disposed on the peripheral area of the substrate, wherein each of the plurality of metal traces has a sidewall and a top surface;
a plurality of covers disposed on the peripheral area of the substrate and each covering the sidewall and the top surface of a corresponding metal trace of the plurality of metal traces, wherein:
   each of the plurality of covers at least comprises metal nanowires, and
   the plurality of covers and the plurality of metal traces have different etch resistances due to a material composition of the plurality of covers having a first etch rate to an etchant and a material composition of the plurality of metal traces having a second etch rate to the etchant; and
a touch sensing electrode disposed on the display area of the substrate, wherein:
   the touch sensing electrode is electrically connected with the plurality of metal traces,
   the plurality of metal traces comprises a material different from the metal nanowires,
   the metal nanowires have a first etch resistance to the an etchant,
   the material of the plurality of metal traces has a second etch resistance to the etchant,
   the first etch resistance is higher than the second etch resistance,
   the touch sensing electrode comprises one or more touch electrodes, and
   the one or more touch electrodes and the plurality of covers consist of a same material composition.

12. The touch panel of claim 11, further comprising a film layer comprising a first portion disposed on the display area of the substrate and a second portion disposed on the peripheral area of the substrate, wherein:
   the metal nanowires are embedded in the second portion of the film layer to integrally form the plurality of covers to cover the sidewall and the top surface of each of the plurality of metal traces, and
   the metal nanowires are embedded in the first portion of the film layer to integrally form the touch sensing electrode.

13. The touch panel of claim 12, further comprising:
a non-conductive region disposed on the display area of the substrate and the peripheral area of the substrate, wherein:
   the non-conductive region disposed on the peripheral area of the substrate electrically insulates adjacent covers of the plurality of covers,
   the one or more touch electrodes comprise a plurality of touch electrodes, and
   the non-conductive region disposed on the display area of the substrate electrically insulates adjacent touch electrodes of the plurality of touch electrodes.

14. The touch panel of claim 13, wherein a filling layer having a same material as that of the film layer is filled in the non-conductive region.

15. The touch panel of claim 14, wherein a concentration of the metal nanowires in the filling layer is zero.

16. The touch panel of claim 14, wherein:
the metal nanowires are embedded in the filling layer, and
a concentration of the metal nanowires embedded in the filling layer is less than a percolation threshold, such that the metal nanowires embedded in the filling layer form a non-conductive network.

17. The touch panel of claim 11, wherein:
the plurality of metal traces and the plurality of covers extend to a bonding area,
the metal nanowires in the bonding area protrude from the plurality of covers and are exposed, and
an external circuit board is electrically connected with the plurality of metal traces through the exposed metal nanowires of the plurality of covers in the bonding area.

18. The touch panel of claim 11, wherein:
the plurality of metal traces and the plurality of covers extend to a bonding area,
the plurality of covers have a via hole in the bonding area, and
an external circuit board is electrically connected with the plurality of metal traces through the via hole.

19. The trace structure of claim 1, wherein the first metal trace comprises a continuous layer of metal extending under the metal nanowires of the first cover.

20. The trace structure of claim 1, wherein the bottom surface of the first metal trace is in direct contact with the substrate.

\* \* \* \* \*